(12) United States Patent
Kidoh

(10) Patent No.: US 7,176,511 B2
(45) Date of Patent: Feb. 13, 2007

(54) SEMICONDUCTOR MEMORY DEVICE AND METHOD OF MANUFACTURING THE SAME

(75) Inventor: Masaru Kidoh, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 56 days.

(21) Appl. No.: 10/806,399

(22) Filed: Mar. 23, 2004

(65) Prior Publication Data

US 2005/0145912 A1  Jul. 7, 2005

(30) Foreign Application Priority Data

Jan. 7, 2004 (JP) ............................. 2004-002230

(51) Int. Cl.
*H01L 29/788* (2006.01)
*H01L 27/108* (2006.01)
*H01L 29/76* (2006.01)
*H01L 29/94* (2006.01)

(52) U.S. Cl. ..................... 257/296; 257/301; 257/320

(58) Field of Classification Search ............... 438/243, 438/386; 257/296, 301, 330
See application file for complete search history.

(56) References Cited

U.S. PATENT DOCUMENTS 5,182,224 A * 1/1993 Kim et al. ................. 438/243
5,349,218 A * 9/1994 Tadaki et al. .............. 257/301
5,998,821 A * 12/1999 Hieda et al. ............... 257/301
6,207,494 B1   3/2001 Graimann et al.
6,693,005 B2 * 2/2004 King .......................... 438/243

FOREIGN PATENT DOCUMENTS

| JP | 4-256359  | 9/1992 |
| JP | 5-67749   | 3/1993 |
| JP | 10-223860 | 8/1998 |

* cited by examiner

*Primary Examiner*—Chuong Anh Luu
(74) *Attorney, Agent, or Firm*—Oblon, Spivak, McClelland, Maier & Neustadt, P.C.

(57) ABSTRACT

A semiconductor memory device includes a first insulation film which is provided on the inner surface of a trench formed in a semiconductor substrate and has its top located above the surface of the semiconductor substrate. A diffusion layer is formed within the semiconductor substrate, surrounding the deep portion of the trench. A first conductive layer is filled in the trench. A gate electrode is provided on a gate insulation layer formed on the surface of the semiconductor substrate. Source/drain diffusion layers are formed in the surface of the semiconductor substrate and sandwich a channel region below the gate electrode. A second conductive layer extends on the first conductive layer, the first insulation layer, and one of the source/drain diffusion layers.

20 Claims, 21 Drawing Sheets

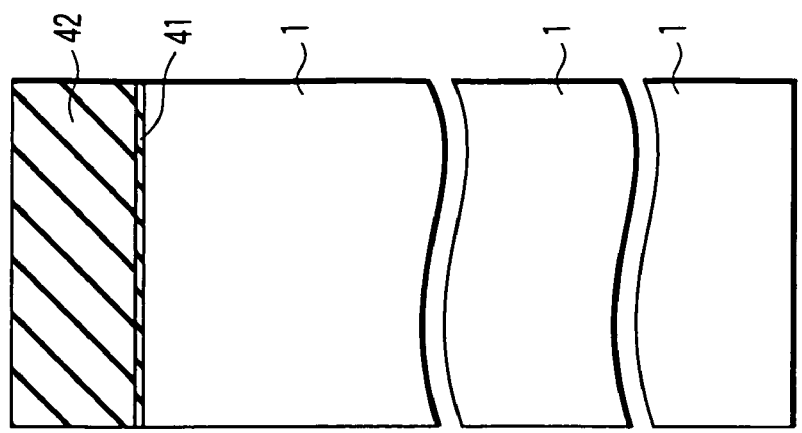
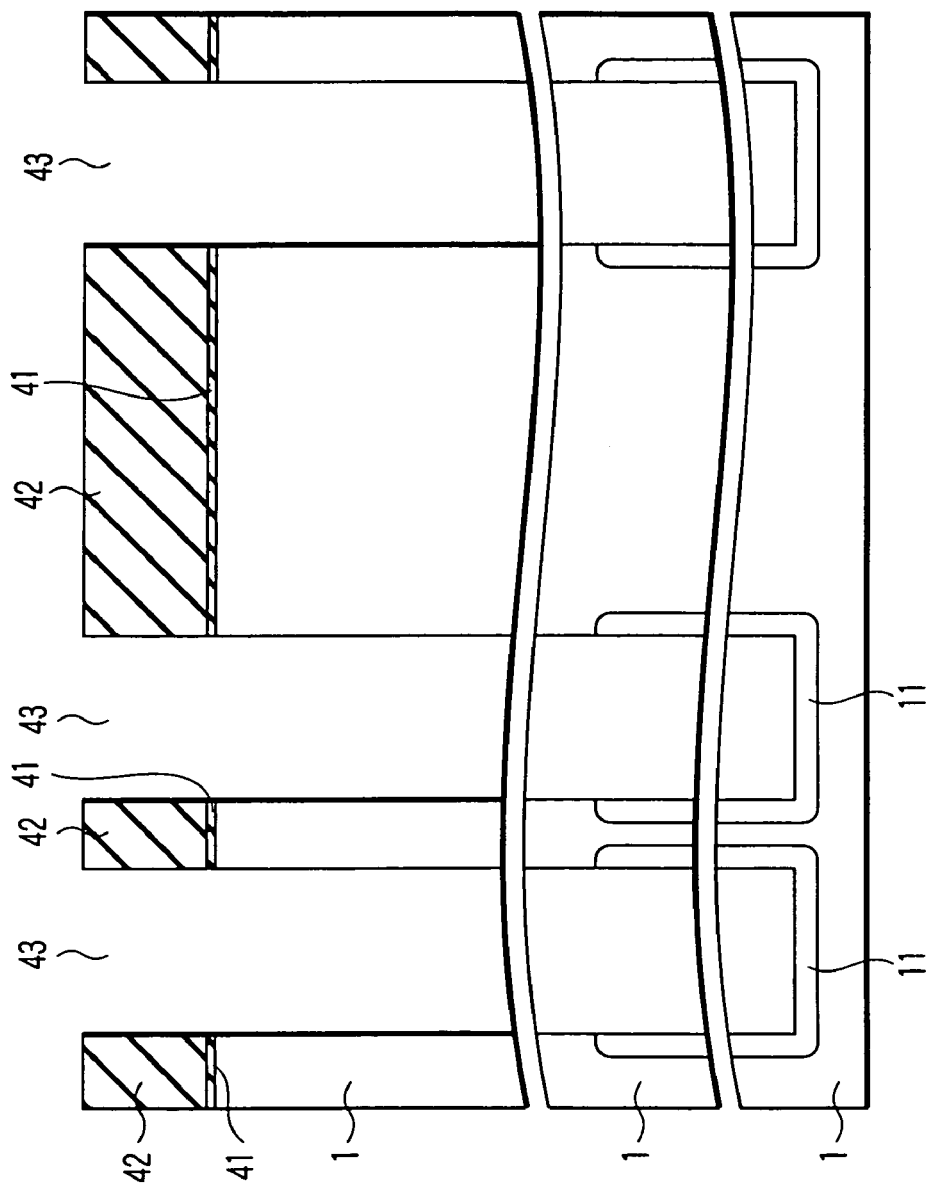
FIG. 2A
FIG. 2B

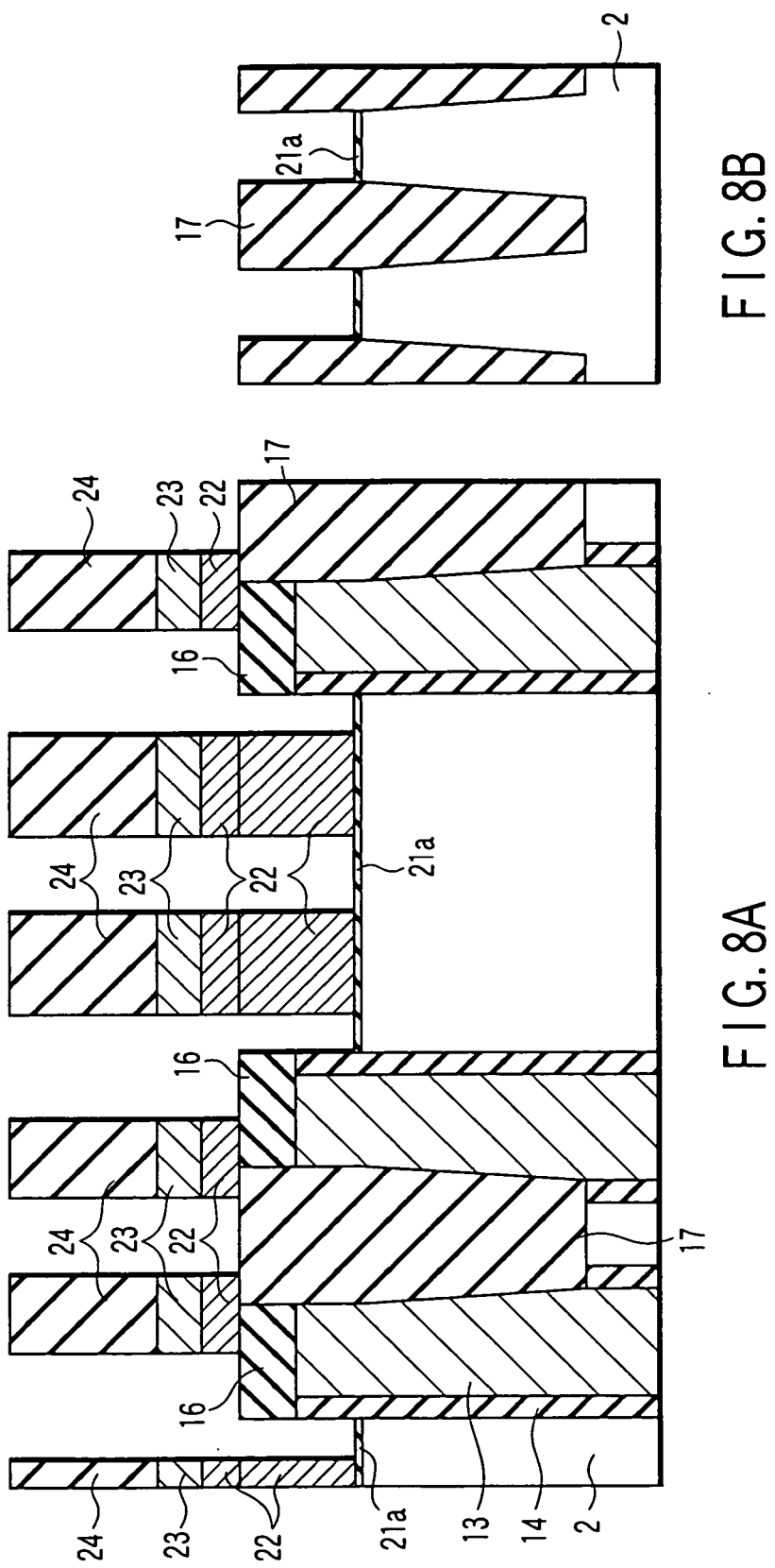

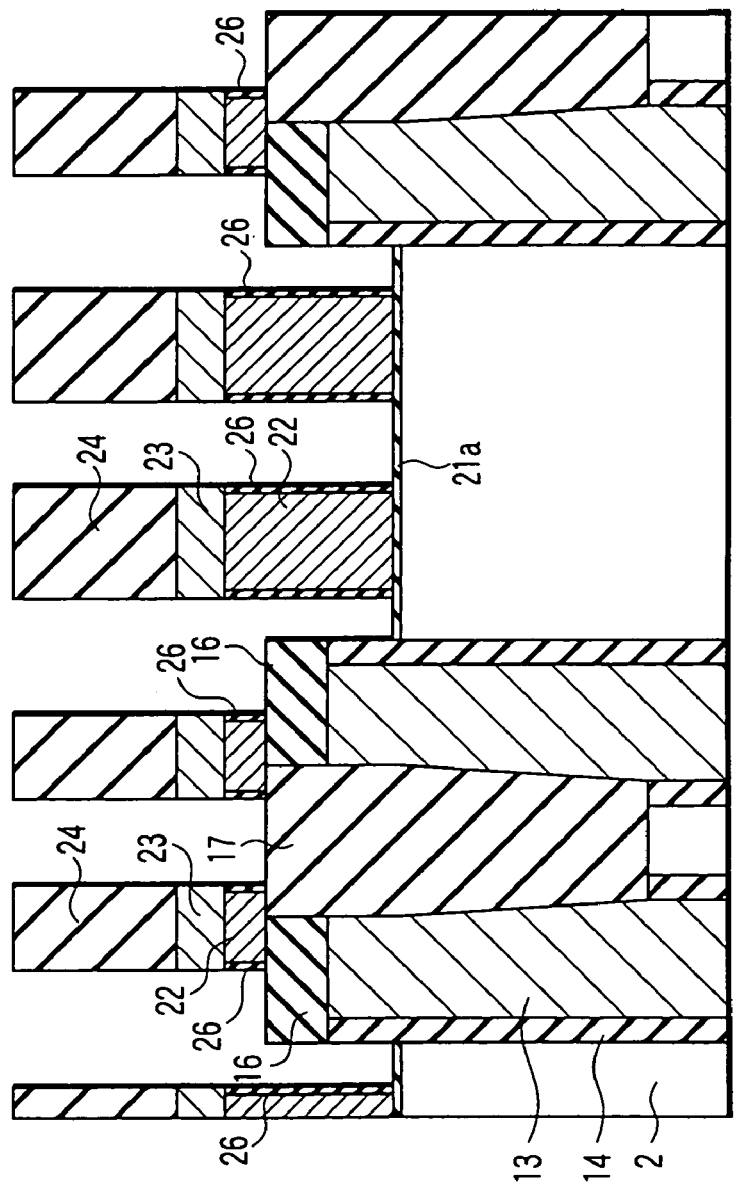
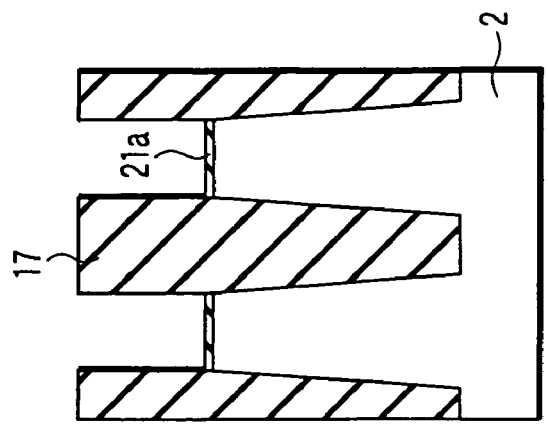
FIG. 9A
FIG. 9B

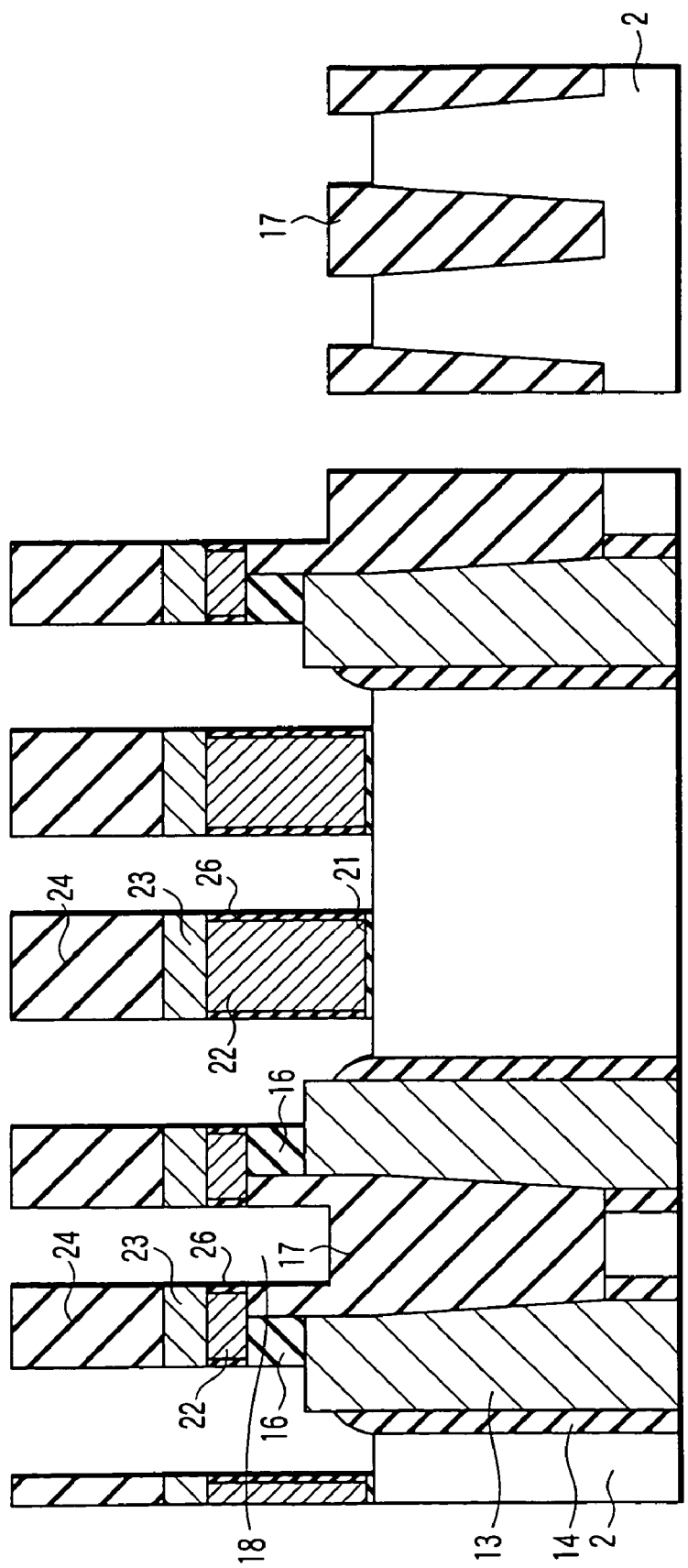

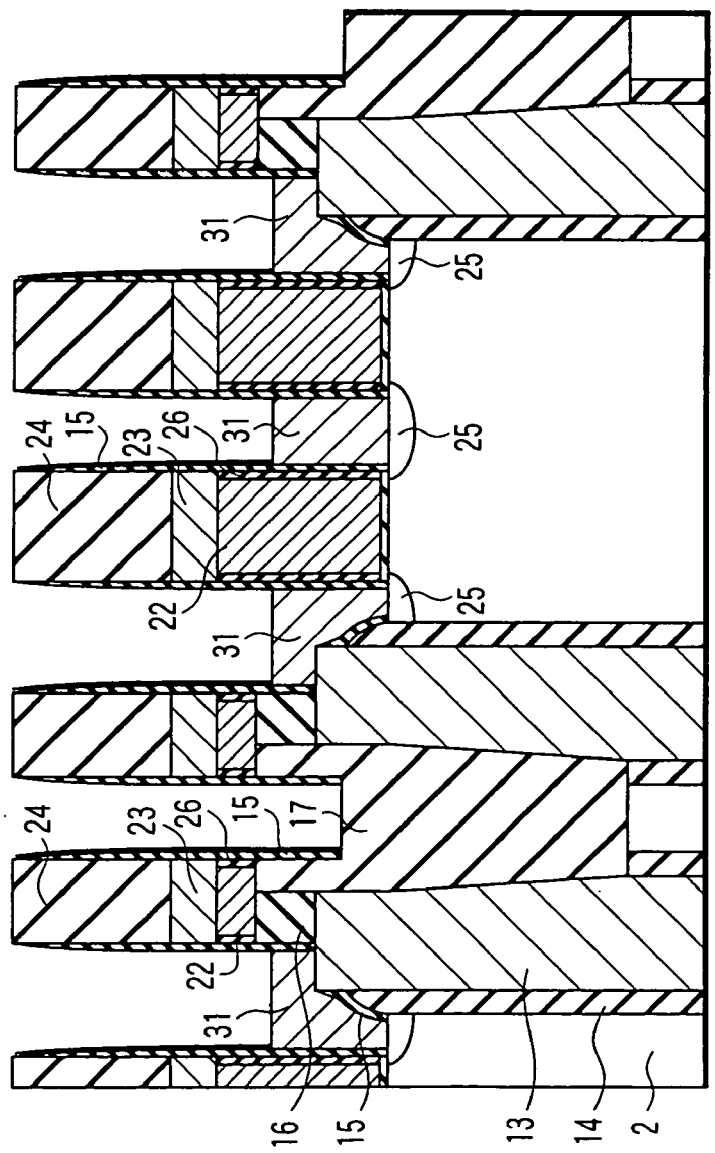
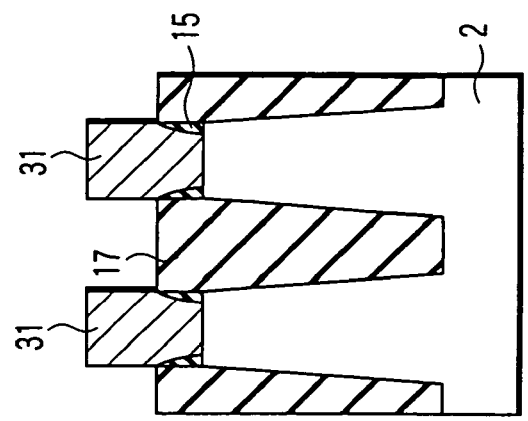
FIG. 12A
FIG. 12B

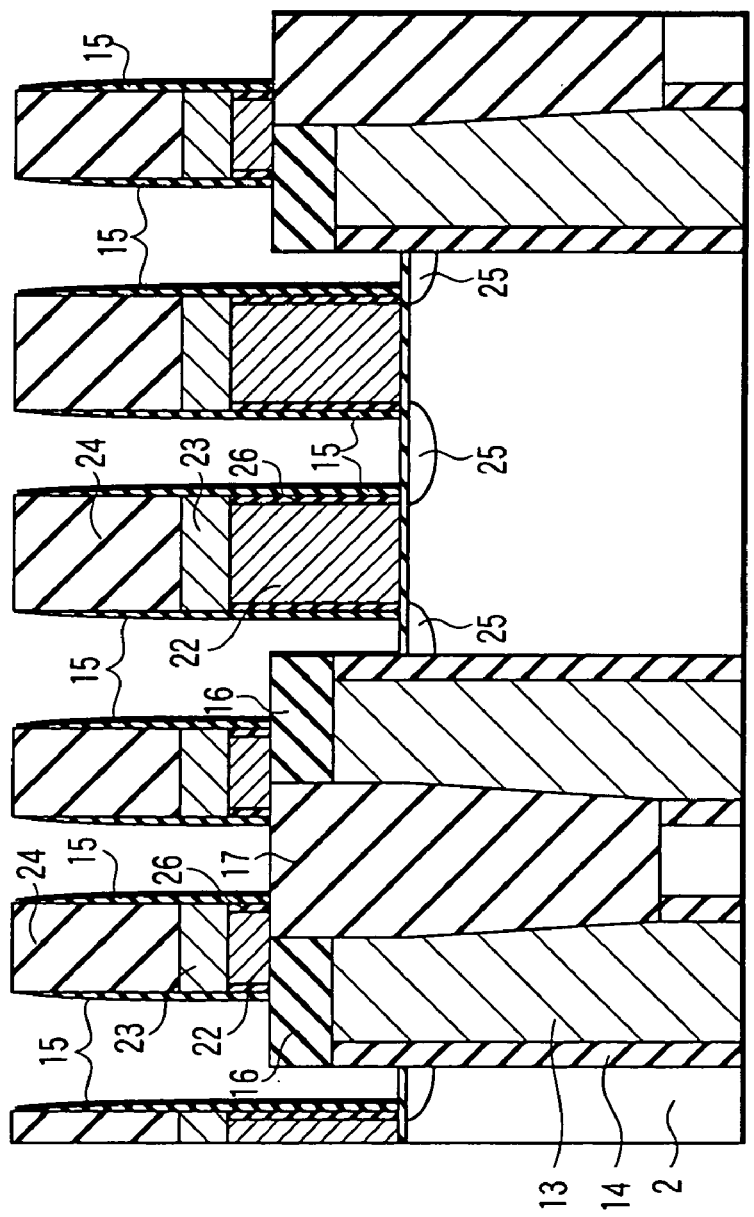
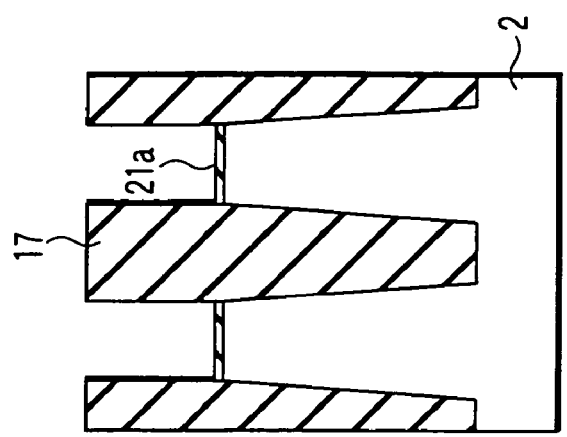
FIG. 14A
FIG. 14B

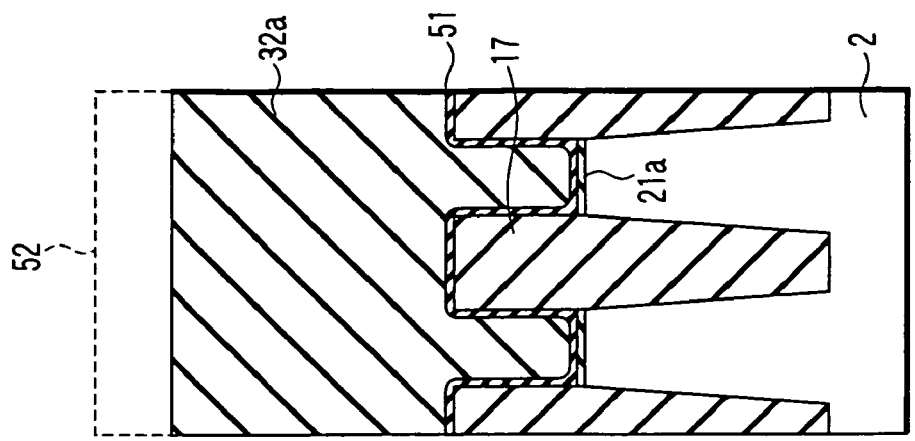
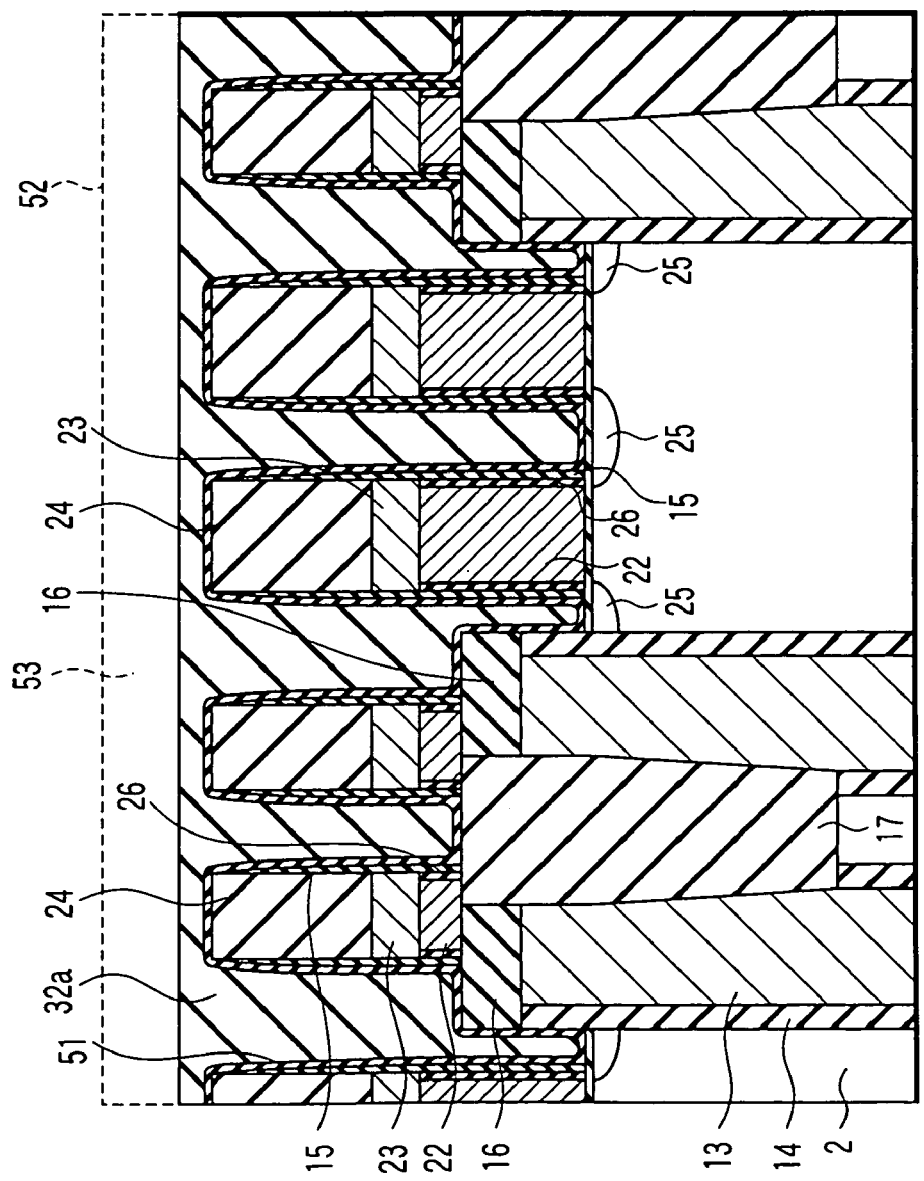
FIG. 15A
FIG. 15B

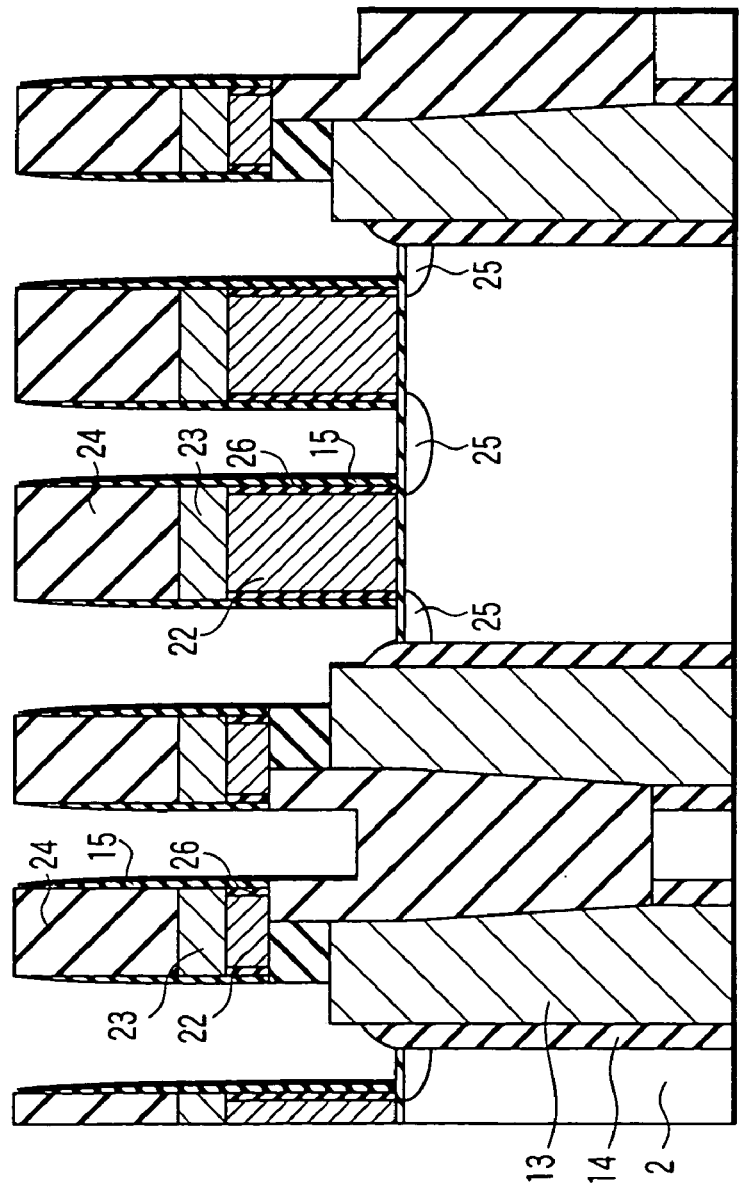
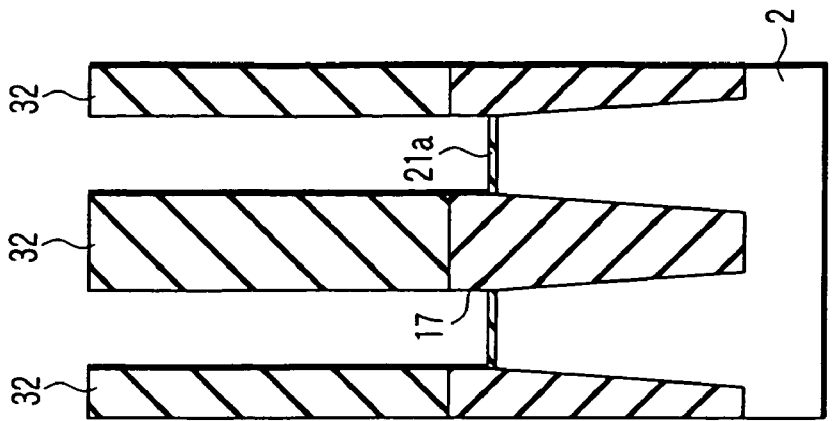
FIG. 17A
FIG. 17B

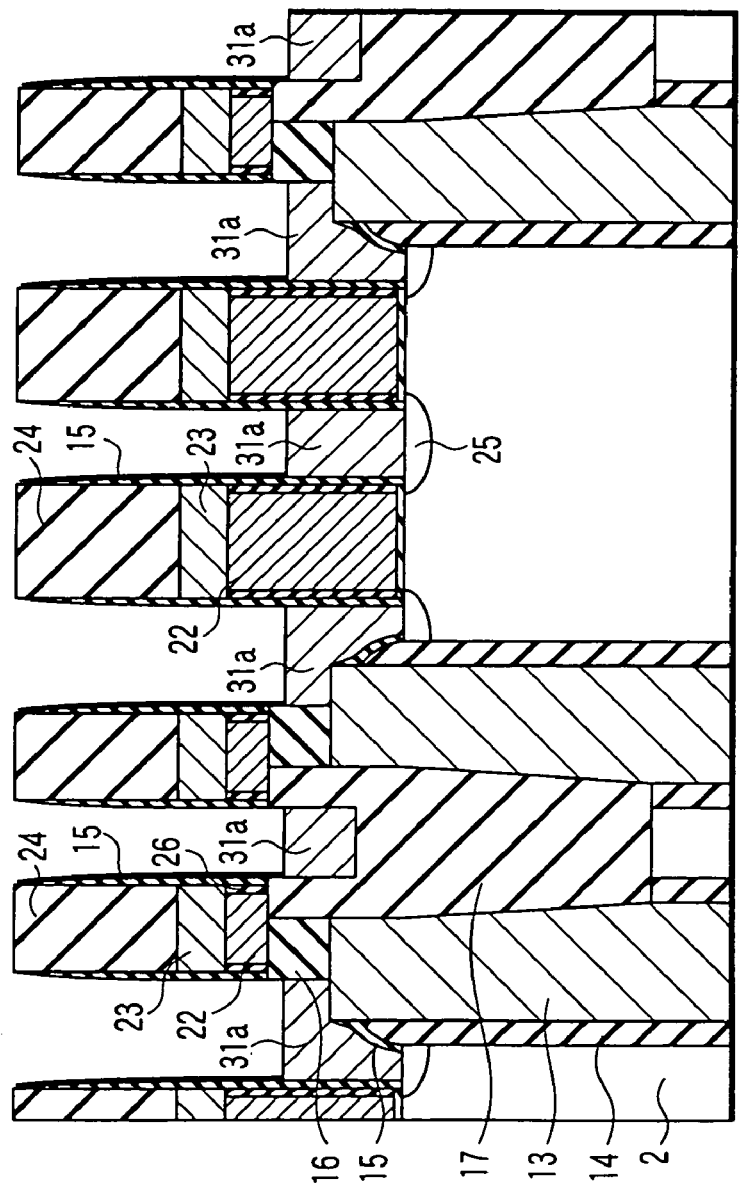
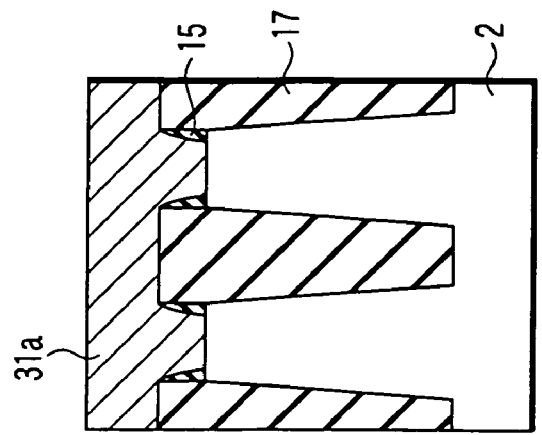
FIG. 19A
FIG. 19B

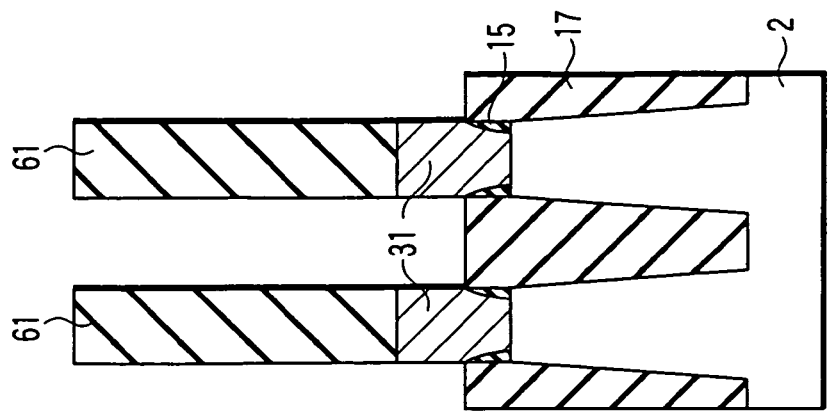
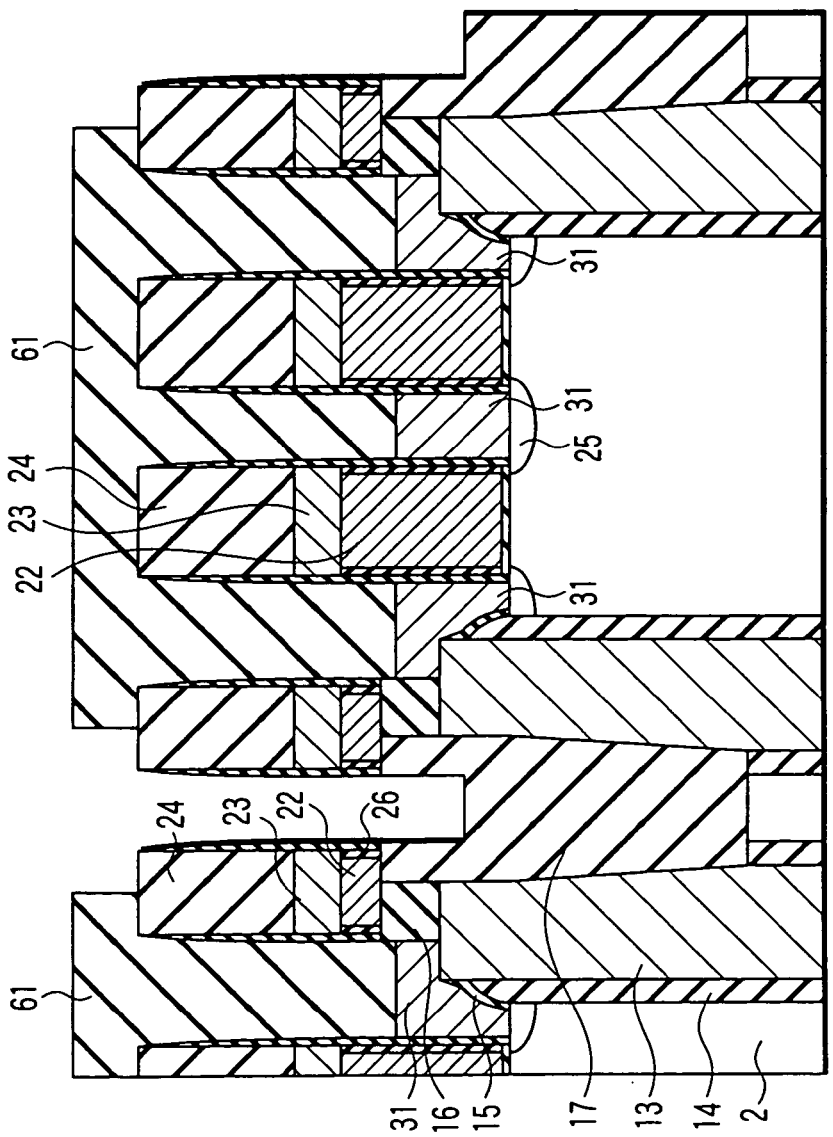

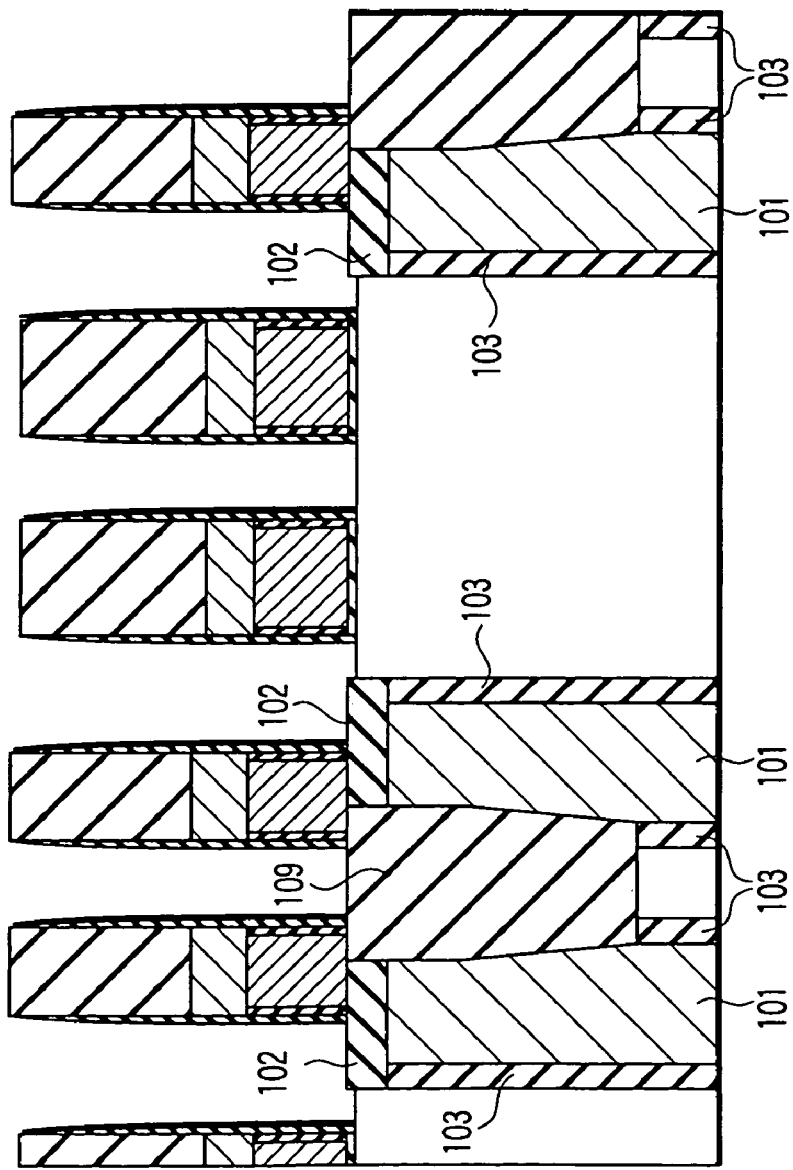
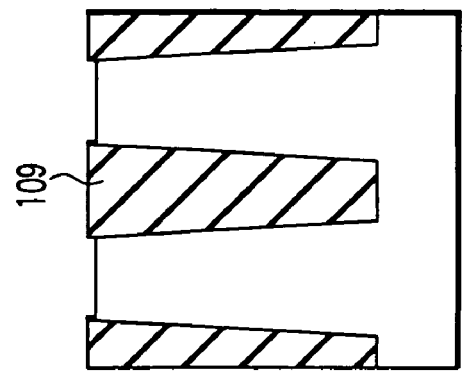
FIG. 23A PRIOR ART
FIG. 23B PRIOR ART

SEMICONDUCTOR MEMORY DEVICE AND METHOD OF MANUFACTURING THE SAME

CROSS-REFERENCE TO RELATED APPLICATIONS

This application is based upon and claims the benefit of priority from prior Japanese Patent Application No. 2004-002230, filed Jan. 7, 2004, the entire contents of which are incorporated herein by reference.

BACKGROUND OF THE INVENTION

1. Field of the Invention

The present invention relates to a semiconductor memory device, for example, a dynamic random access memory (DRAM) or DRAM-incorporated device, and a method of manufacturing the same.

2. Description of the Related Art

In a DRAM or embedded DRAM device (hereinafter referred simply to as a DRAM), a surface strap (SS) type of contact is known which is used to make connection between a memory capacitor formed in a deep trench (DT) and an active area (AA). The SS contact is provided on a semiconductor substrate and formed of a layer of, for example, conductive polysilicon which extends from the capacitor to the active area. By this contact, the capacitor is connected to a source/drain diffusion layer of a transfer gate MOS (metal oxide semiconductor) transistor formed on the semiconductor substrate.

FIGS. 23A and 23B and FIGS. 24A and 24B show sectional structures of a DRAM having SS contacts in the order of steps of manufacture. As shown in FIGS. 23A and 23B, to expose storage nodes 101 prior to formation of contacts (conductive layer), a portion of the surface of each of a trench top insulation (trench top oxide) layer 102 and a device isolation insulation layer 109 is etched away. At this point, since the top portion of a collar oxide layer 103 is also etched away at the same time, a groove 104 is formed on it and consequently the side of a semiconductor substrate 105, such as silicon, is exposed. As a result, a connecting conductive layer 106 is also formed inside the groove as shown in FIGS. 24A and 24B.

Impurities penetrating from the connecting conductive layer 106 into the side of the semiconductor substrate 105 diffuse within the substrate to form unwanted diffusion layers 108 in the position deeper than source/drain diffusion layers 107a. The presence of each diffusion layer 108 causes a degradation in the punch-through characteristic between the diffusion layer 108 and a source/drain diffusion layer 107b which are opposed to each other with the gate interposed therebetween.

As shown in FIG. 24B, the surface of the semiconductor substrate 105 protrudes from the surface of the device isolation insulation layer 109. For this reason, when the connecting conductive layer 106 is formed through epitaxial growth from the semiconductor substrate 105, the silicon crystal may grow from the sidewall of the semiconductor substrate 105. In such a case, silicon on each sidewall of the semiconductor substrate 1 may come into contact with silicon on the adjacent sidewall, causing a short circuit.

BRIEF SUMMARY OF THE INVENTION

According to a first aspect of the present invention, there is provided a semiconductor device comprising: a semiconductor substrate; a first insulation layer formed on an inner surface of a trench formed in the semiconductor substrate and having its top located above the surface of the semiconductor substrate; a diffusion layer formed within the semiconductor substrate, surrounding the deep portion of the trench; a first conductive layer filled in the trench; a gate electrode provided on a gate insulation layer formed on the surface of the semiconductor substrate; source/drain diffusion layers formed in the surface of the semiconductor substrate, sandwiching a channel region below the gate electrode; and a second conductive layer extending on the first conductive layer, the first insulation layer, and one of the source/drain diffusion layers.

According to a second aspect of the present invention, there is provided a method of manufacturing a semiconductor device comprising: forming a capacitor in a trench formed in a semiconductor substrate, the capacitor having a first dielectric layer whose top is at a first level above the surface of the semiconductor substrate and a first conductive layer which fills the trench; forming a second insulation layer on the first insulation layer and the first conductive layer in an upper portion of the trench; forming a transistor on the semiconductor substrate, the transistor having a gate electrode and source/drain diffusion layers formed in the surface of the semiconductor substrate, the source/drain diffusion layers sandwiching a channel region below the gate electrode; removing a portion of the second insulation layer to expose a top of the first conductive layer; and forming a connecting conductive layer on the exposed first conductive layer and one of the source/drain diffusion layers.

BRIEF DESCRIPTION OF THE SEVERAL VIEWS OF THE DRAWING

FIGS. 2A, 3A, 4A, 5A, 6A, 7A, 8A, 9A, 10A, 11A and 12A are sectional views, in the order of steps of manufacture, of the semiconductor memory device according to the first embodiment and correspond to FIG. 1A;

FIGS. 2B, 3B, 4B, 5B, 6B, 7B, 8B, 9B, 10B, 11B and 12B are sectional views, in the order of steps of manufacture, of the semiconductor memory device according to the first embodiment and correspond to FIG. 1B;

FIGS. 14A, 15A and 17A are sectional views, in the order of steps of manufacture, of the semiconductor memory device according to the second embodiment and correspond to FIG. 13A;

FIGS. 14B, 15B and 17B are sectional views, in the order of steps of manufacture, of the semiconductor memory device according to the second embodiment and correspond to FIG. 13B;

FIGS. 18A, 19A and 20A are sectional views, in the order of steps of manufacture, of a semiconductor memory device according to a third embodiment of the present invention;

FIGS. 18B, 19B and 20B are sectional views, in the order of steps of manufacture, of the semiconductor memory device according to the third embodiment;

FIG. 23A and 23B are sectional views of a semiconductor memory device illustrating steps in a conventional process of manufacture thereof.

DETAILED DESCRIPTION OF THE INVENTION

Figure 1B:
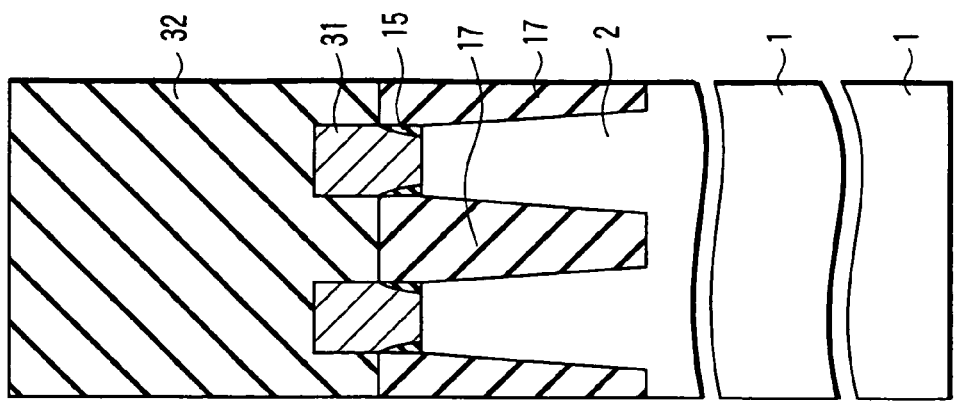
FIGS. 1A and 1B are sectional views of a semiconductor memory device according to a first embodiment of the present invention.

The preferred embodiments of the present invention will be described hereinafter with reference to the accompanying drawings. In the description which follows, the same or functionally equivalent elements are denoted by like reference numerals to thereby simplify the description.

[First Embodiment]

Figure 1A:
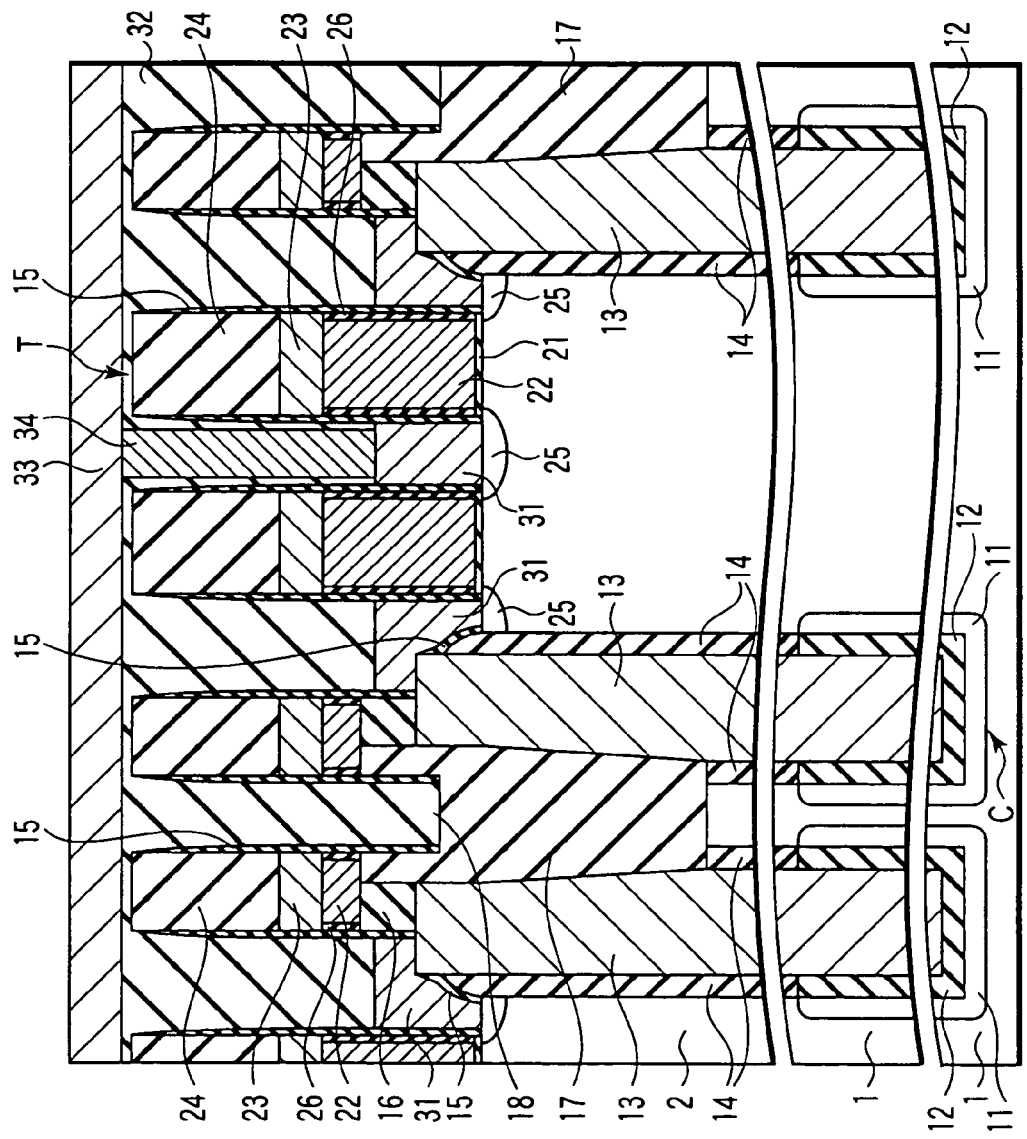

FIGS. 1A and 1B are sectional views of a semiconductor memory device according to a first embodiment of the present invention, which are taken in mutually orthogonal directions. As shown in FIGS. 1A and 1B, a well region 2 is formed in the surface of a semiconductor substrate 1. A trench capacitor C is formed in the surface of the semiconductor substrate 1. A MOS transistor T is formed on the semiconductor substrate 1 (active area). The capacitor C and the MOS transistor T functioning as an array transistor form a DRAM memory cell.

The capacitor C is comprised of a diffusion layer 11 which forms its plate electrode, a capacitor insulation layer 12, a storage node 13, and a collar oxide layer 14. The diffusion layer 11 is formed by being diffused with impurities of, for example, As. The capacitor insulation layer 12 is formed so that its top is at substantially the same level as the top of the diffusion layer 11 formed into the surface of the deep portion of the trench.

The collar oxide layer 14, which consists of, for example, silicon oxide, is formed on the inner surface of the trench (the side of the semiconductor substrate) to extend from the top of the capacitor insulation layer 12 to the surface of the semiconductor substrate 1. The top of the collar oxide layer 14 is at the same level as or protrudes from the surface of the semiconductor substrate 1. In the trench, the collar oxide layer 14 contacts the side of the semiconductor substrate 1 in order not to expose the side of the semiconductor substrate 1 at least in the position below the bottom of a source/drain diffusion layer 25 to be described later. In order not to expose the side of the semiconductor substrate 1 within the trench, it is better to form the collar oxide layer 14 on the side of the semiconductor substrate 1 so as to extend to its surface. Since the collar oxide layer 14 contacts the side of the semiconductor substrate 1 within the trench, no gap is formed between the collar oxide layer 14 and the sidewall of the semiconductor substrate 1 in this portion.

A spacer insulation layer 15 is formed on that surface of the collar insulation layer 14 which is exposed from the surface of the semiconductor substrate 1. The spacer insulation layer 15 is formed from the same material as a spacer insulation layer formed on the sidewall of the gate electrode structure of a transistor to be described later. A typical example of this material is silicon nitride.

The storage node 13 is formed on the capacitor insulation layer 12 and the collar insulation layer 14 within the trench so as to fill the trench. The storage node is formed of polysilicon rendered conductive by being implanted with impurities. The top of the storage node 13 is located above the surface of the semiconductor substrate 1.

A trench top insulation layer 16 is formed on top of the storage node 13 and extends from one end to the vicinity of the center of the storage node 13. The trench top insulation layer 16 is formed of the same material as the collar oxide layer 14, which is typically silicon oxide. The thickness of the trench top insulation layer 16 is in the range from 50 to 100 nm.

A device isolation insulation layer 17 is provided from the surface of the trench top insulation layer 16 toward the inside of the semiconductor substrate 1. A portion of the device isolation insulation layer protrudes from the top of the storage node 13 to contact the trench top insulation layer 16. The device isolation insulation layer 17 has a groove 18 between gate structures to be described later above the trench. The groove 18 is formed so that its bottom is located a little lower than the top of the storage node 13 and higher than the surface of the semiconductor substrate 1. The device isolation insulation layer has an STI (shallow trench isolation) structure and is formed of, say, silicon oxide.

The transistor T has a gate structure extending in the direction penetrating FIG. 1A. The gate structure is composed of a gate insulation layer 21, a gate electrode 22, a silicide layer 23, and a cap insulation layer 24. The sidewall of the gate electrode 22 is oxidized and formed with a post oxide layer 26. The gate structure has its gate insulation layer 21 removed in the area of the capacitor C (on the trench top insulation layer 16 and the device isolation insulation layer 17). Source/drain diffusion layers 25 are formed in the surface of the semiconductor substrate 1 (active area surface) so that they are opposed to each other with a channel region below the gate structure interposed therebetween. The source/drain diffusion layer 25 is common to adjacent transistors on the semiconductor substrate 1. A spacer insulation layer 15 is formed on the sidewall of the gate structure. The spacer insulation layer 15 is also formed on the sidewall of the device isolation insulation layer 17 in the groove 18.

The gate electrode 22 is formed of polysilicon rendered conductive by being implanted with impurities. The silicide layer 23 is formed of, say, tungsten silicide. The cap insulation layer 24 is formed from the same material as the spacer insulation layer 15, which is typically silicon nitride.

The gate structure above the trench is provided on the trench top insulation layer 16 and that portion of the device isolation insulation layer 17 which protrudes from the storage node 13. The sidewall of the groove 18 of the device isolation insulation layer 17 is aligned with the edge of the gate structure above the trench.

A surface strap type connecting conductive layer 31 is formed to a given thickness in the area between the gate structure above the trench and the transistor T on the semiconductor substrate 1. That is, the connecting conductive layer 31 is formed on the storage node 13, the spacer insulation layer 15 on the collar oxide layer 14, and the semiconductor substrate 1 (more specifically, the source/drain diffusion layer 25). The connecting conductive layer 31, which is formed of monocrystalline or polycrystalline silicon rendered conductive by being introduced with impurities, electrically connects the storage node 13 and the source/drain diffusion layer 25. Since the collar insulation layer 14 contacts the overall side of the semiconductor substrate 1 within the trench as described above, the connecting conductive layer 31 will never contact the side of the semiconductor substrate 1.

The connecting conductive layer 31 is also formed on a portion of the semiconductor substrate 1 located between transistors T. An interlayer insulation layer 32, consisting of, say, silicon oxide (SiO), is deposited over the entire surface of the semiconductor substrate 1. An interconnect layer 33 and a contact 34 are formed in the interlayer insulation layer 32. The contact 34 electrically connects the interconnect layer 33 with one of the source/drain diffusion layers 25 which is not connected to the capacitor C. Though not shown, in a section different from FIG. 1A, the cap insulation layer 24 has its portion removed for formation of a contact therein.

Figure 3A:
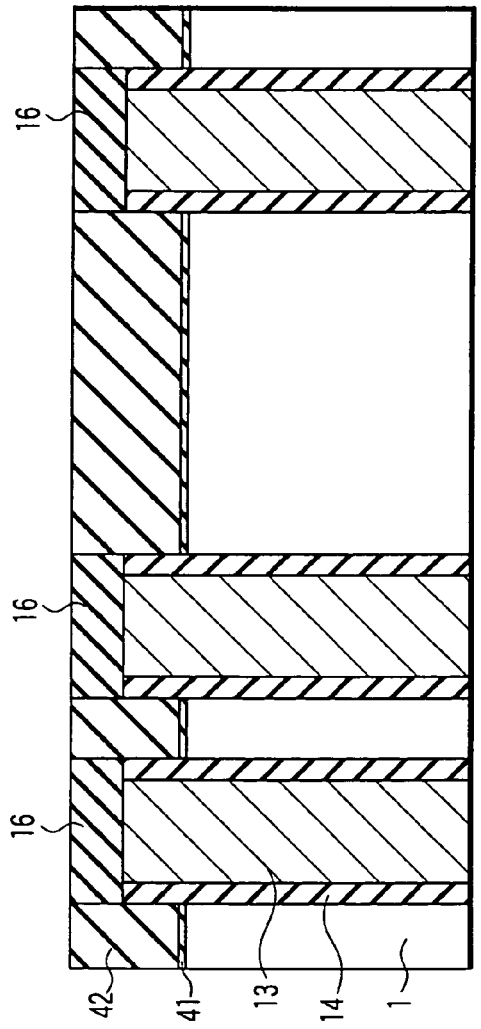
Figure 3B:
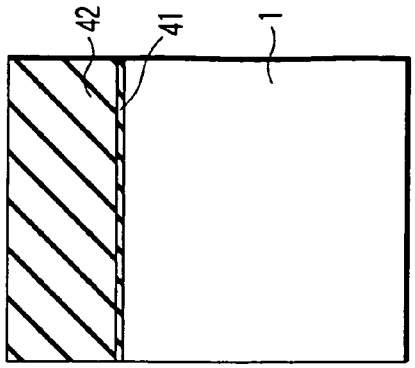

Next, a method of manufacturing the semiconductor memory device shown in FIGS. 1A and 1B will be described with reference to FIGS. 2A and 2B through FIGS. 12A and 12B. FIGS. 2A through 12A are sectional diagrams corresponding to FIG. 1A, in the order of steps of manufacture, of the semiconductor memory device. FIGS. 2B through 12B are sectional diagrams corresponding to FIG. 1B, in the order of steps of manufacture, of the semiconductor memory device. In FIGS. 3A and 3B and subsequent drawings, only the portion above the well region 2 in FIGS. 1A and 1B is illustrated.

As shown in FIGS. 2A and 2B, a silicon oxide layer 41 and a pad insulation layer 42 consisting of, for example, silicon nitride are formed in sequence over the entire surface of the semiconductor substrate 1. The thickness of the pad insulation layer 42 forms a factor in determining the amount that the collar oxide layer 14 protrudes from the surface of the semiconductor substrate 1. That is, first, a portion of the trench top insulation layer 16 is etched away under condition that assures the storage node 13 to be exposed and the collar oxide layer 14 is also etched back under the condition in a subsequent step. Secondly, the top end of the collar oxide layer 14 needs to protrude much enough before the etching step to keep protruding even after the step. Thirdly, a position of the top end of the collar oxide 14 is defined by the thickness obtained by subtracting the thickness of the trench top insulation layer 16 from that of the pad insulation layer 42. Considering these elements, the thickness of the pad insulation layer 42 is set at 150 to 250 nm.

Next, trenches 43 are formed in the pad insulation layer 42 and the semiconductor substrate 1 by means of lithographic and anisotropic etching (such as RIE) techniques. Next, a layer of, for example, AsCG is deposited on the side of the deep portion of each trench and then subjected to heat treatment, whereby the diffusion layer 11 is formed.

Next, as shown in FIGS. 3A and 3B, the capacitor insulation layer 12 (not shown) and the collar oxide layer 14 are formed up to the level at which the underneath of the trench insulation layer 16 is to be located by means of CVD (chemical vapor deposition) and the trench 43 is then filled with a material of the storage node 13. As a result, the collar oxide layer 14 protrudes from the surface of the semiconductor substrate 1 by about 50 to 100 nm. The storage node 13 is also formed up to the same level as the top end of the collar oxide layer 14. Next, using CVD and CMP (chemical mechanical polishing) techniques, the trench top insulation layer 16 is formed on the collar oxide layer 14 and the storage node 13 so that it is at the same level as the pad insulation layer 42.

This process is actually composed of a plurality of steps. For example, the process involves the following steps. First, after the formation of the capacitor insulation layer 12, the material of the storage node 13 is deposited up to the level of the top end of the capacitor insulation layer 12. Then, a material of the collar oxide layer 14 is deposited on the remaining side surface of the trench 43 and on the pad insulation layer 42. The material layer then etched back so that its top end is at a predetermined level in the trench 43. Next, the material of the storage node 13 is filled in the remaining portion of the trench 43 and deposited on the pad insulation layer 42 and then etched back so that it is at the same level as the collar oxide layer 14.

Figure 4A:
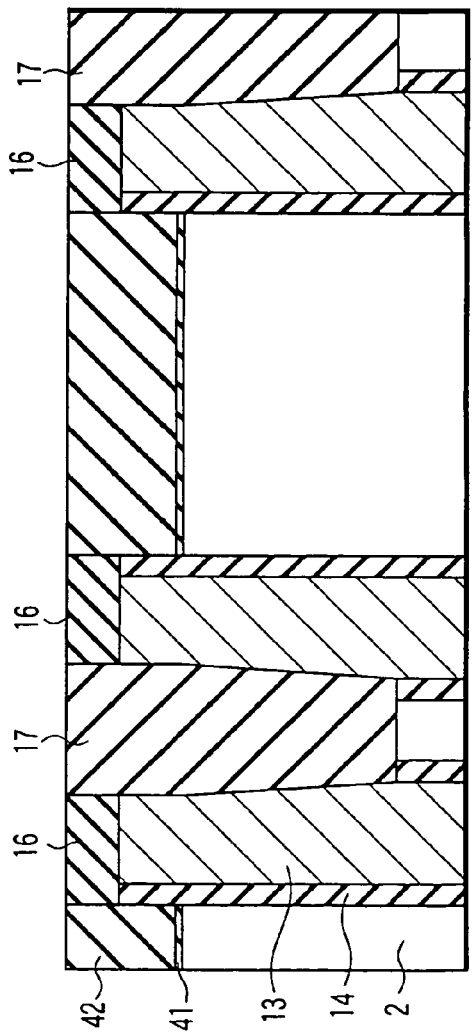
Figure 4B:
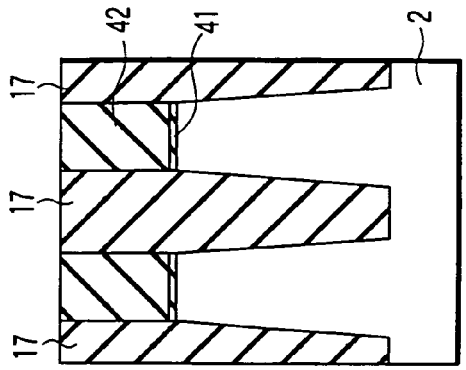

Next, as shown in FIGS. 4A and 4B, by using lithographic and anisotropic etching (such as RIE) techniques, trenches for the device isolation insulation layer 17 are formed. Then, the device isolation insulation layer 17 is formed in the trench by means of CVD and CMP. Next, the well region 2 is formed by means of ion implantation and thermal diffusion.

Figure 5B:
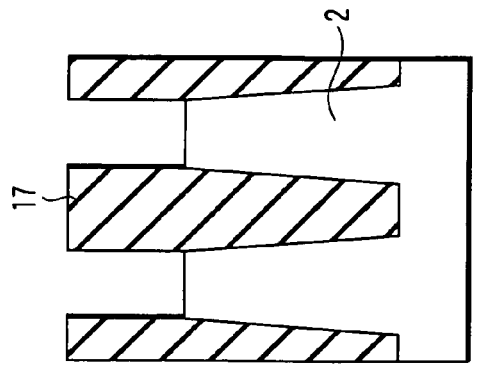
Figure 5A:
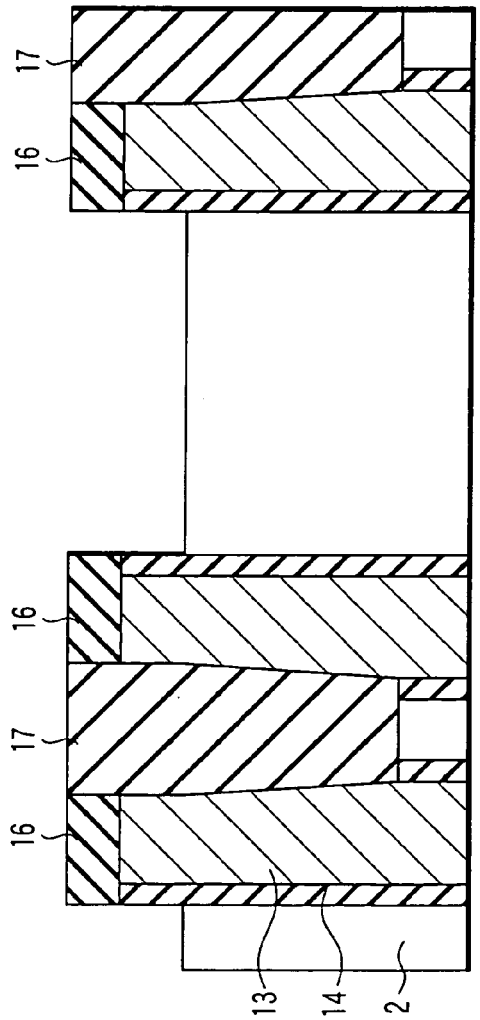

Next, as shown in FIGS. 5A and 5B, the pad insulation layer 42 and the silicon oxide layer 41 are removed by means of, for example, wet etching. As a result, the surface of the semiconductor substrate 1 is exposed.

Figure 6B:
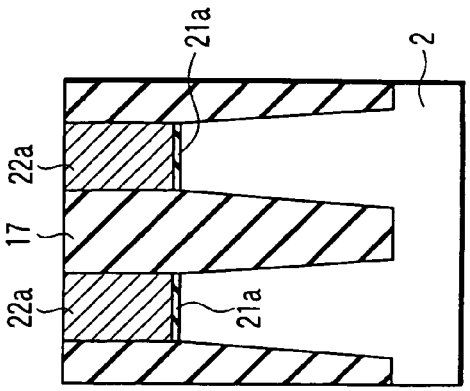
Figure 6A:
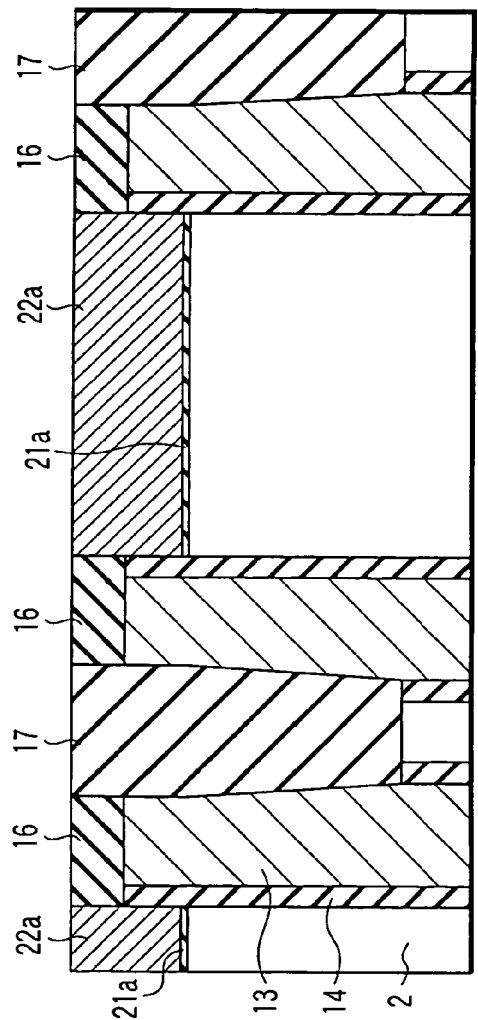

Next, as shown in FIGS. 6A and 6B, a layer 21a of the material of the gate insulation layer 21 is formed on the exposed surface of the semiconductor substrate 1. Then, a layer 22a of the material of the gate electrode 22 is deposited over the entire surface of the semiconductor substrate 1 by means of, for example, CVD. The material layer 22a is then planarized by CMP using the trench top insulation layer 16 and the device isolation insulation layer 17 as stopper.

Figure 7A:
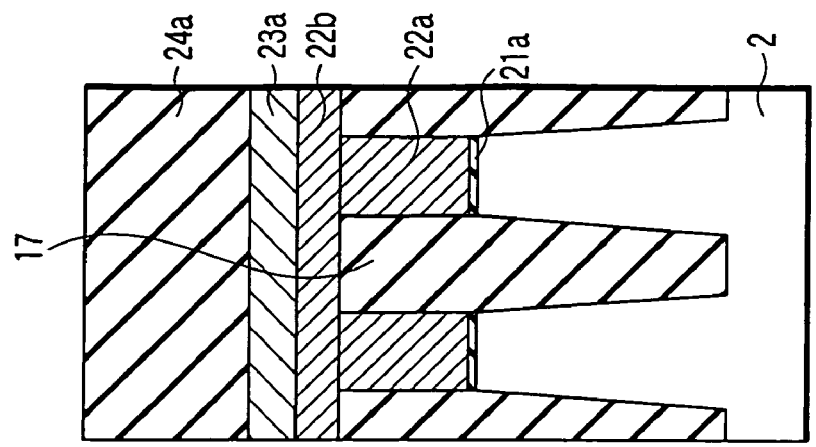
Figure 7B:
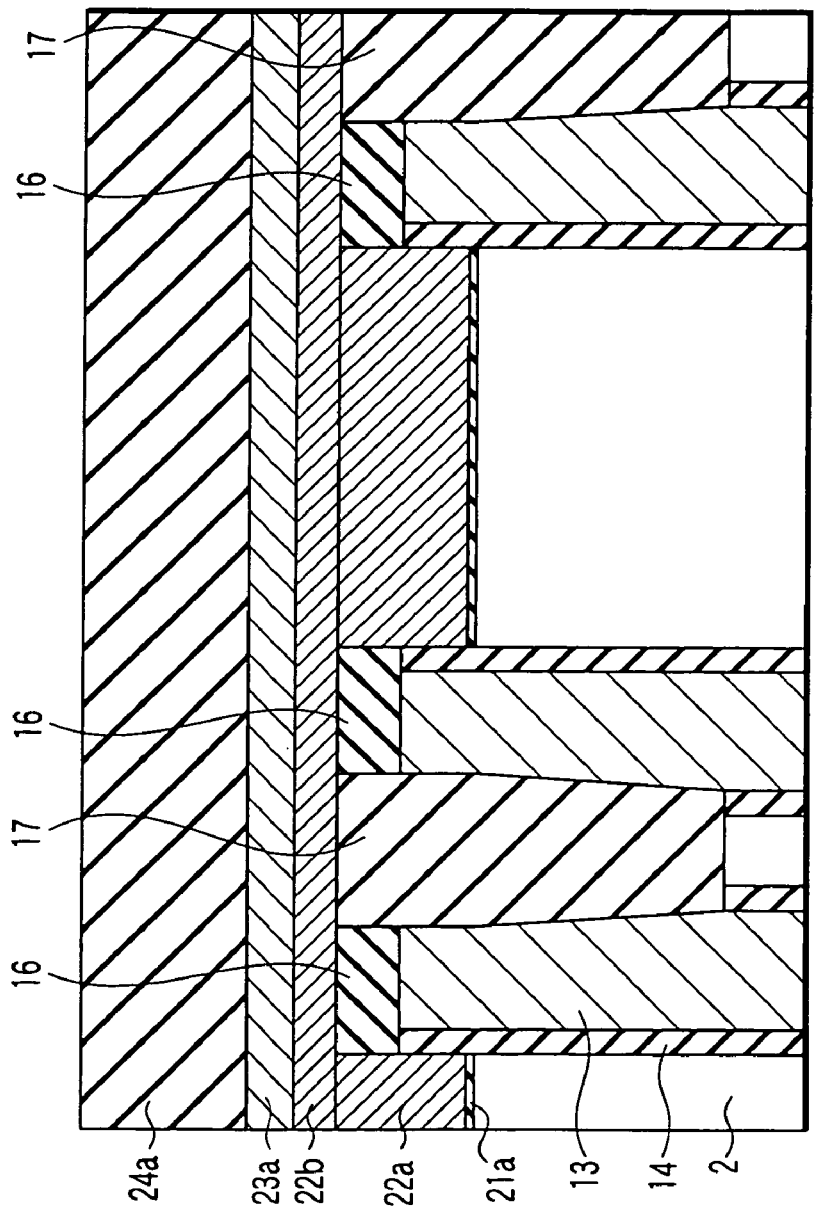

Next, as shown in FIGS. 7A and 7B, using, for example, CVD a layer 22b of the material for the gate electrode 22 is formed over the entire surface of the semiconductor substrate 1, i.e., on the material layer 22a, the trench top insulation layer 16 and the device isolation insulation layer 17. A layer 23a of the material for the silicide layer 23 is then formed over the entire surface of the layer 22b by, for example, sputtering. Next, a layer 24a of the material for the cap insulation layer 24 is formed over the entire surface of the layer 23a by using, for example, CVD.

Next, as shown in FIGS. 8A and 8B, the material layer 24a is formed on top with a mask material (not shown) having openings defined in a pattern of gate electrodes and then patterned by means of anisotropic etching such as RIE using the mask material. As a result, the cap insulation layer 24 is formed. The mask material is then removed. Next, the material layers 23a, 22a and 22b are patterned by means of anisotropic etching such as RIE using the cap insulation layer 24 as a mask to form the gate electrodes 22 covered with the silicide layer 23.

Next, as shown in FIGS. 9A and 9B, the sidewall of each of the gate electrodes 22 is oxidized by thermal oxidation to form the post oxide layer 26.

Next, as shown in FIGS. 10A and 10B, portions of the trench top insulation layer 16 and the device isolation insulation layer 17 are removed by means of anisotropic etching such as RIE using the cap insulation layer 24 as a mask. Taking into consideration variations in the thickness of the trench top insulation layer 16, the etching conditions at this time are set so as to ensure the trench top insulation layer on the storage node 13 to be removed and the top of the storage node to be exposed. That is, etching is performed under conditions of slight overetching. As a result, the groove 18 the bottom of which is located below the top of the storage node 13 is formed in the surface of the device isolation insulation layer 17 between transistors T.

This etching process causes the top end of the collar oxide layer 14 to retreat. However, since the collar oxide layer 14 is formed so as to protrude from the surface of the semiconductor substrate 1 by the amount described above, its top end will not retreat below the surface of the semiconductor substrate. By this etching process, the material layer 21a is patterned to form the gate insulating layer 21. When the source/drain diffusion layers 25 of the transistor T are formed into the LDD (lightly doped drain) structure, source/drain extension layers (not shown) are formed by ion implantation using the material layer 24a as a mask after this etching process.

Figure 11A:
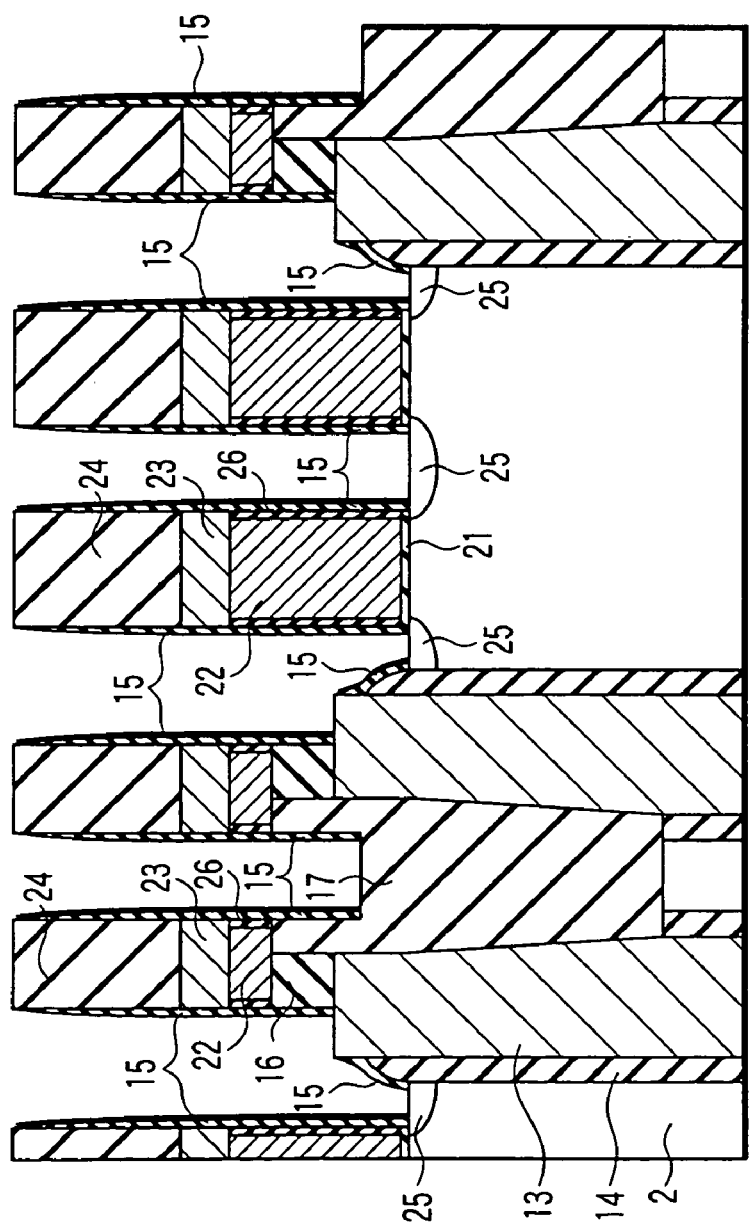
Figure 11B:
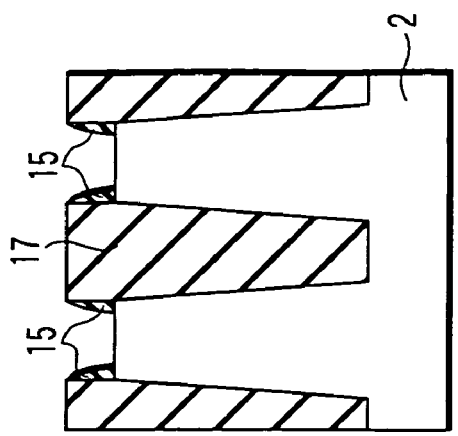

Next, as shown in FIGS. 11A and 11B, using CVD and etchback, the spacer insulation layer 15 is formed on the sidewall of each gate structure, the sidewall of the trench top insulation layer 16, the inner surface of the groove 18 in the device isolation insulation layer 17, and the collar oxide layer 14. Then, the source/drain diffusion layers 25 are formed by means of ion implantation using the spacer insulation layer 15 and the cap insulation layer 24 as a mask.

Next, as shown in FIGS. 12A and 12B, a silicon layer is grown from the surface of the semiconductor substrate 1 to a predetermined thickness by means of selective epitaxial growth techniques. On the semiconductor substrate on that side of the transistor T which faces the capacitor C, the silicon layer grows to overlie the storage node 13. As a result, the portion between the transistor T and the gate structure on the trench is filled with the silicon layer. By introducing impurities into the silicon layer, the connecting conductive layer 31 is formed.

Next, as shown in FIGS. 1A and 1B, a material layer for the interlayer insulation layer 32 is deposited over the entire surface of the semiconductor substrate 1 by means of CVD. Consequently, the portion between each transistor is filled with this material layer. The surface of this material layer is planarized by means of CMP to form the interlayer insulation layer 32. Next, a contact hole for the contact 34 is formed by using lithographic and anisotropic etching (such as RIE) techniques. The resultant contact hole is then filled with a conducting material such as amorphous silicon, whereby the contact 34 is formed. Then, an interconnect groove for the interconnect layer 33 is formed by means of lithographic and anisotropic etching (such as RIE) techniques. Next, the interconnect groove is filled with a conducting material, thereby forming the interconnect layer 33.

According to the semiconductor memory device of the first embodiment of the present invention, the collar oxide layer 14 is formed in the trench 43 to protrude from the semiconductor substrate 1 with no gap formed therebetween. Therefore, the connecting conductive layer 31 can be formed on the semiconductor substrate 1 and the storage node 13 without contacting the sidewall of the semiconductor substrate within the trench. For this reason, it is possible to avoid penetration of impurities from the connecting conductive layer 31 through the sidewall of the trench 43 into the semiconductor substrate 1. It is therefore possible to prevent unwanted diffusion layers from being formed below the source/drain diffusion layers 25, allowing a semiconductor memory device having transistors with good punch-through characteristics to be implemented.

In addition, according to the first embodiment, is the surface of the semiconductor substrate 1 is located below the surface of the device isolation insulation layer 17; When the connecting conductive layer 31 is formed through epitaxial growth, therefore, it is possible to prevent silicon from growing from the sidewalls of the semiconductor substrate 1. It is therefore possible to exclude the possibility that silicon grown on each sidewall of the exposed semiconductor substrate may contact silicon on another sidewall.

Moreover, according to the first embodiment, the spacer insulation layer 15 is formed in the active area (see FIG. 1B) to extend from the surface of the semiconductor substrate 1 to the sidewall of the device isolation insulation layer 17. When silicon crystal is epitaxially grown from the surface of the semiconductor substrate 1 without such a spacer insulation layer 15, a facet may be formed in the silicon crystal. That is, silicon crystal having a plane that is at an angle relative to the surface of the semiconductor substrate 1, such as a triangle with the substrate surface as the base, may be formed. In such a case, the formation of the contact 34 becomes difficult. In contrast to this, in the first embodiment, the formation of the spacer insulation layer 15 controls the formation of the facet, allowing the conductive layer 31 the top of which is substantially parallel to the surface of the semiconductor substrate 1 to be formed. The spacer insulation layer 15 on the collar insulation layer 14 has also a function of preventing the collar oxide layer 14 from retreating at the time of a process of, for example, removing native oxide on the surface of the semiconductor substrate 1 using chemicals.

[Second Embodiment]

Figures 13A, 13B:
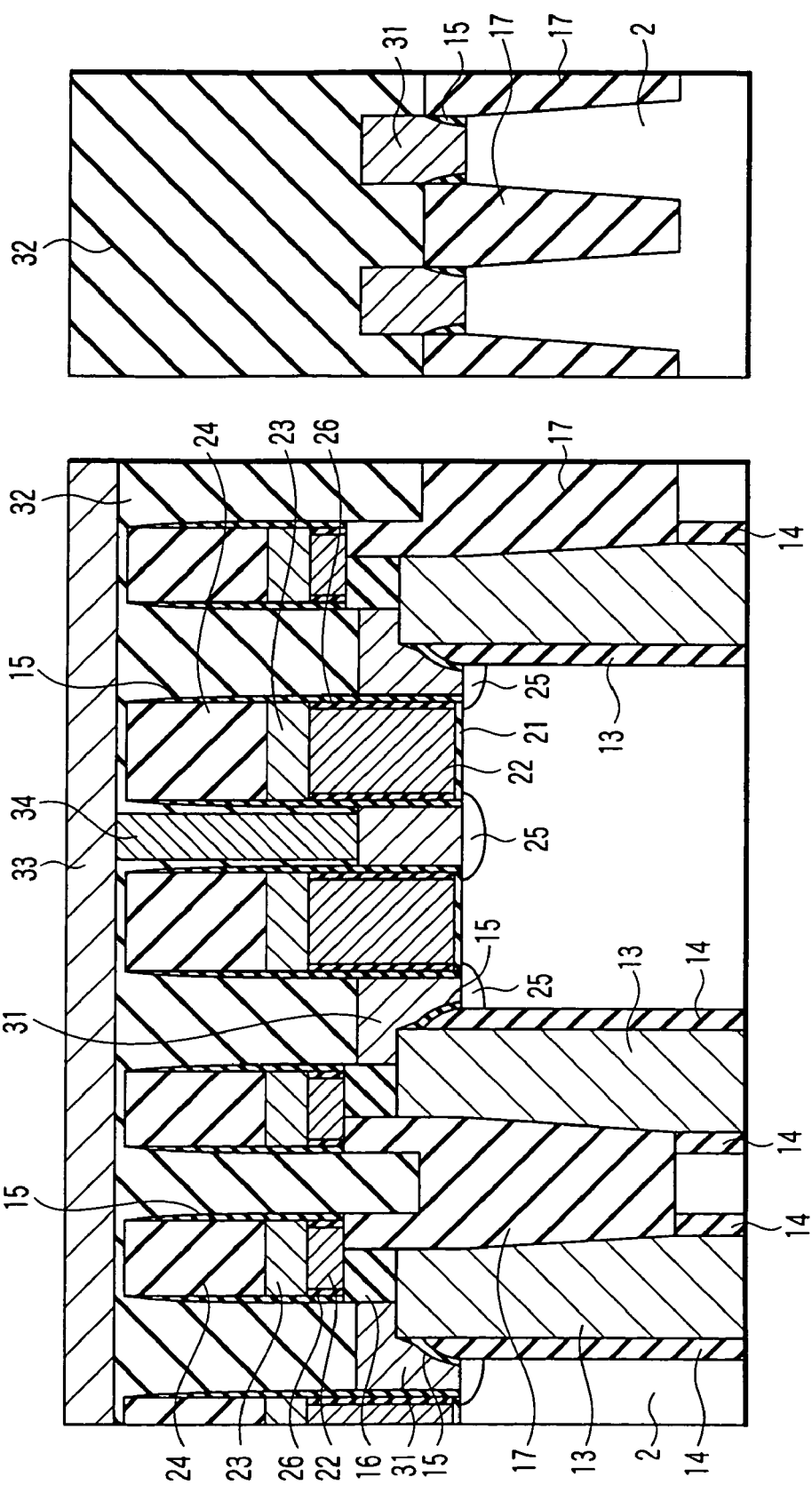
FIGS. 13A and 13B are sectional views of a semiconductor memory device according to a second embodiment of the present invention.

The second embodiment relates to another example of a method of manufacturing the semiconductor memory device according to the first embodiment. FIGS. 13A and 13B are sectional diagrams, taken in orthogonal directions, of a semiconductor memory device according to the second embodiment of the present invention. The semiconductor memory device according to the second embodiment is the same as that of the first embodiment except for the following points. That is, since the second embodiment differs from the first embodiment in the manufacturing process, the spacer insulation layer 15 is not formed on the sidewall of the groove 18 in the device isolation insulation layer 17 and the sidewall of the trench top insulation layer 16.

The method of manufacturing the semiconductor memory device according to the second embodiment of the present invention will be described next with reference to FIGS. 14A, 14B, 15A, 15B, 17A and 17B.

FIGS. 14A, 15A and 17A are sectional views, in the order of steps of manufacture, of the semiconductor memory device according to the second embodiment and correspond to FIG. 13A. Also, FIGS. 14B, 15B and 17B are sectional views, in the order of steps of manufacture, of the semiconductor memory device according to the second embodiment and correspond to FIG. 13B.

First, steps up to the steps in FIGS. 9A and 9B in the first embodiment are performed. Next, the spacer insulation layer 15 is formed on the sidewall of the gate structure by using, for example, CVD and etchback as shown FIGS. 14A and 14B. After that, the source/drain diffusion layers 25 are formed in the same way as in the first embodiment. When the source/drain diffusion layers 25 are formed into the LDD structure, extension layers (not shown) are formed by performing ion implantation prior to formation of the spacer insulation layer 15.

Figure 16:
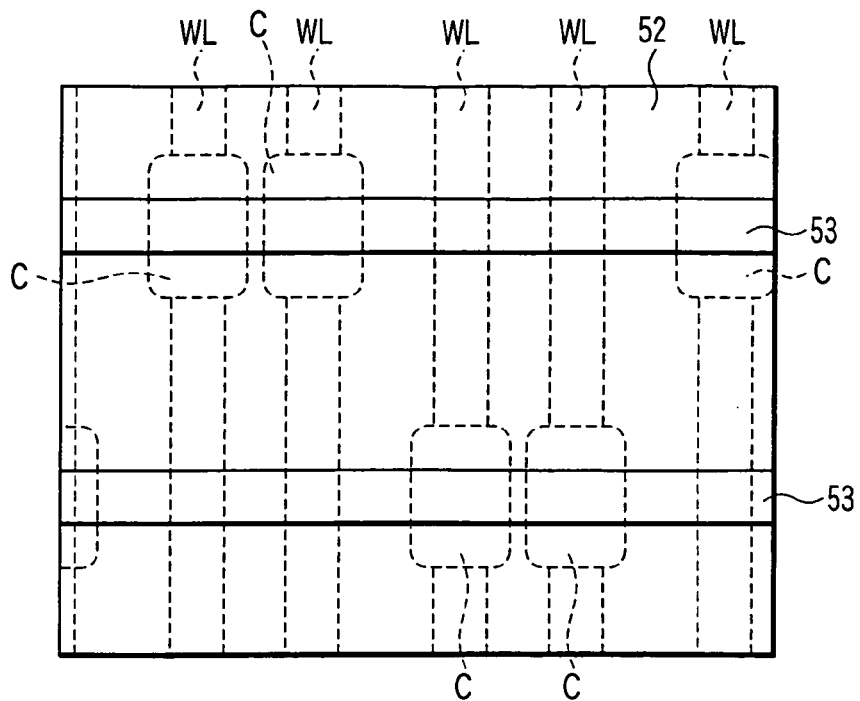
FIG. 16 is a plan view of a mask used in manufacturing the semiconductor device of the second embodiment.

Next, as shown in FIGS. 15A and 15B, a stopper insulation layer 51 is deposited over the entire surface of the semiconductor substrate 1 by means of, for example, CVD. The stopper insulation layer 51 functions as a stopper at the time of removing a material layer 32a between gate structures to be described later and consists of, say, silicon nitride. Then, the material layer 32a for the interlayer insulation layer 32 is formed over the entire surface of the semiconductor substrate 1 by means of, for example, CVD. Consequently, the portion between each gate structure is filled with the material layer 32a. A mask material 52 is formed over the entire surface of the material layer 32a using, for example, CVD and anisotropic etching such as RIE. The mask material 52 has openings 53 above at least the active areas (areas where the transistors T are formed) as shown in FIG. 16. In FIG. 16, WL indicates the gate structure.

Next, as shown in FIGS. 17A and 17B, a portion of the material layer 32a is removed by means of anisotropic etching such as RIE using the mask material 52. The stopper insulation layer 51 is etched away in the areas where the material layer 32 has been removed (openings). Next, as in the case of FIGS. 10A and 10B in the first embodiment, portions of the trench top insulation layer 16 and the device isolation insulation layer 17 are removed until the top of the storage node 13 is exposed using the gate structure and the spacer insulation layer 15 as a mask. The interlayer insulation layer 32 is left on the device isolation insulation layer 17 in other areas than the active areas as shown in FIG. 17B.

The subsequent steps remain unchanged from the steps described in connection with FIGS. 11A, 11B, 12A and 12B in the first embodiment. That is, the spacer insulation layer 15 is formed on the surface of the collar oxide layer 14 in the same way as described in connection with FIGS. 11A and 11B.

Next, as in the case of FIGS. 12A and 12B, the connecting-conductive layer 31 is formed by means of epitaxial growth. The conductive layer can also be formed by filling the openings of the material layer 32a with impurity-introduced polysilicon by using, for example, CVD and etching back the polysilicon to the same level as shown in FIGS. 13A and 13B.

Next, as shown in FIGS. 13A and 13B, the openings in the material layer 32a is refilled with the material of the interlayer insulation layer 32 and the surface is smoothed out to form the interlayer insulation layer 32. Next, the contact 34 and the interconnection layer 33 are formed in the same way as in the first embodiment.

The second embodiment provides the same advantages as the first embodiment.

[Third Embodiment]

The third embodiment relates to still another example of the method of manufacturing the semiconductor memory device according to the first embodiment. After the connecting conductive layer 31 is formed over the entire surface of the semiconductor substrate 1, its unwanted portions are removed. The sectional structures remain unchanged from FIGS. 13A and 13B.

Figures 18A, 18B:
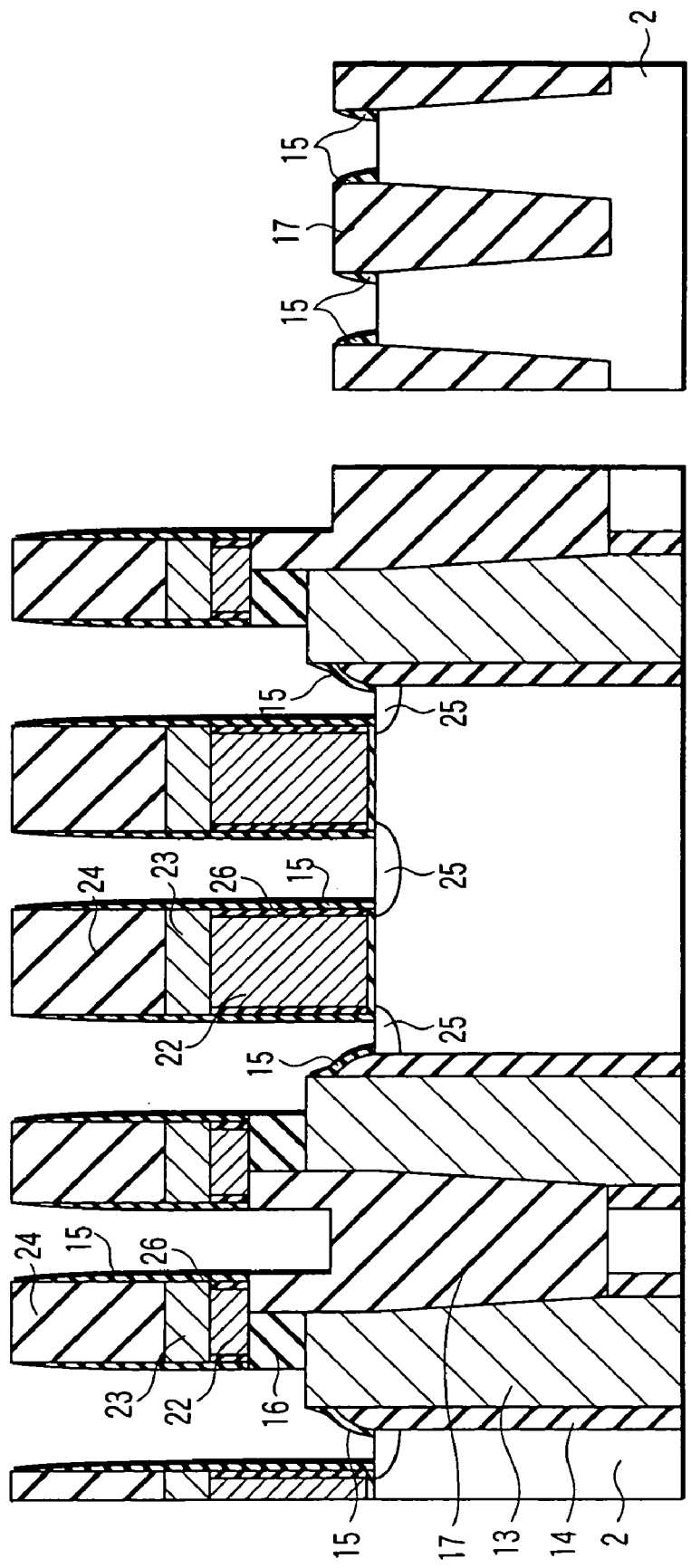

The method of manufacturing a semiconductor memory device according to the third embodiment of the present invention will be described next with reference to FIGS. 18A, 18B, 19A, 19B, 20A and 20B. FIGS. 18A, 19A and 20A are sectional views, in the order of steps of manufacture, of the semiconductor memory device of the third embodiment and correspond to FIG. 13A. Also, FIGS. 18B, 19B and 20B are sectional views, in the order of steps of manufacture, of the semiconductor memory device according to the second embodiment and correspond to FIG. 13B.

First, steps through the steps in FIGS. 14A and 14B in the second embodiment are performed. Next, as in the case of FIGS. 10A and 10B in the first embodiment, portions of the trench top insulation layer 16 and the device isolation insulation layer 17 are removed until the top of the storage node 13 is exposed using the gate structure and the spacer insulation layer 15 as a mask. Next, using, for example, CVD, the spacer insulation layer 15 is formed on the collar oxide layer 14. After that, the source/drain diffusion layers 25 are formed by means of ion implantation. When the source/drain diffusion layers 25 are formed into the LDD structure, extension layers (not shown) are formed by performing ion implantation prior to formation of the spacer insulation layer 15.

Next, as shown in FIGS. 19A and 19B, the portion between each gate structure is filled with the material layer 31a for the connecting conductive layer 31 by means of, for example, CVD. As the material layer 31a use is made of, say, conductive polysilicon. Next, the material layer 31a is etched back to the same level as shown in FIGS. 13A and 13B.

Figure 21:
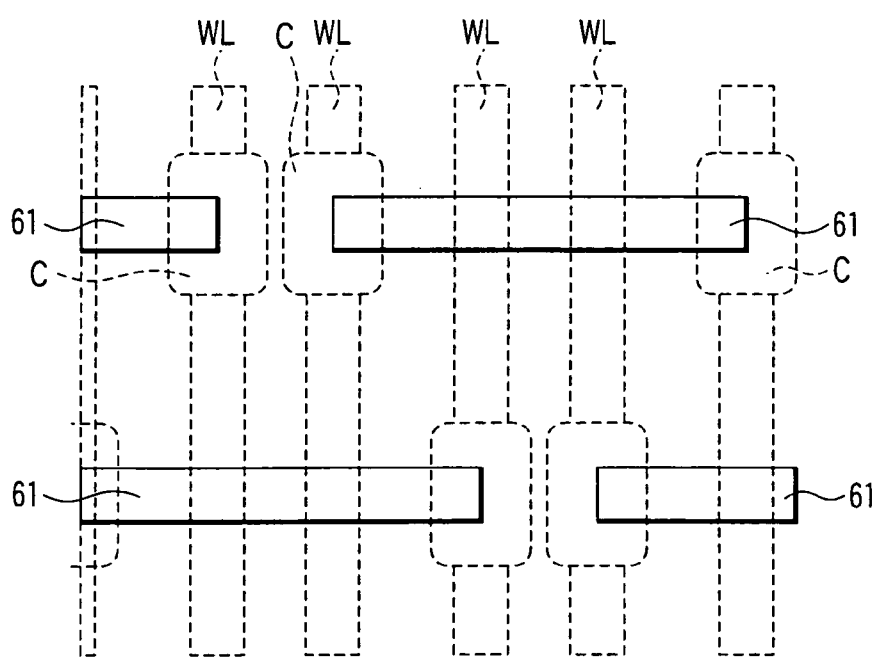
FIG. 21 is a plan view of a mask used in manufacturing the semiconductor device according to the third embodiment.

Next, as shown in FIGS. 20A and 20B, a mask layer 61 is formed over the entire surface of the semiconductor substrate 1. The mask layer has a pattern to shield areas where the connecting conductive layer 31 is to be formed as shown in FIG. 21. After that, the material layer 31a is removed by means of anisotropic etching, such as RIE, using the mask layer 61 as a mask, thereby forming the connecting conductive layer 31. The subsequent steps are the same as in the second embodiment.

According to the semiconductor memory device of the third embodiment, the same advantages as the first embodiment can be provided.

[Fourth Embodiment]

Figures 22A, 22B:
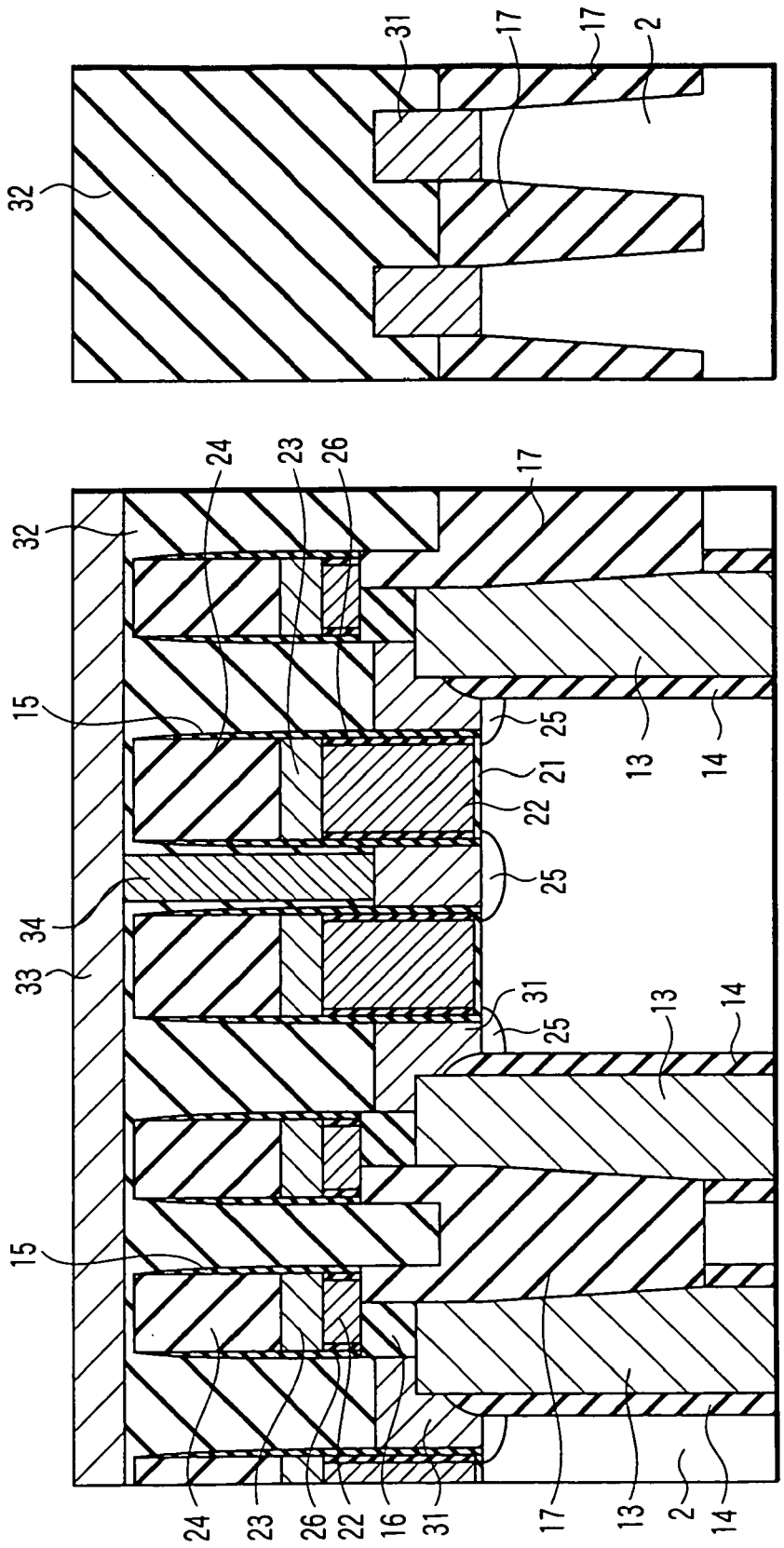
FIGS. 22A and 22B are sectional views of a semiconductor memory device according to a fourth embodiment of the present invention.
Figures 24A, 24B:
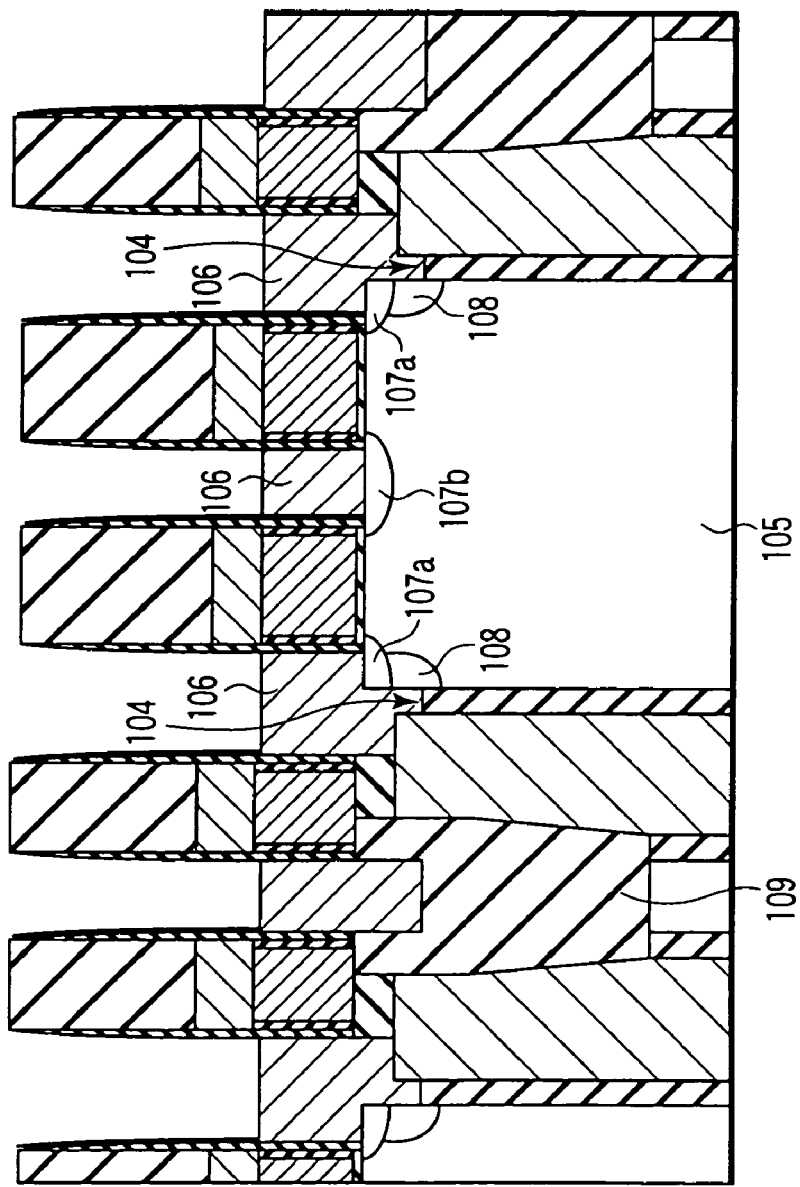
FIG. 24A and 24B are sectional views respectively illustrating manufacturing steps subsequent to the steps of FIGS. 23A and 23B.

In the fourth embodiment, the spacer insulation layer 15 is not formed on the collar oxide layer 14. FIGS. 22A and 22B are sectional views of a semiconductor memory device according to the fourth embodiment of the present invention. The connecting conductive layer 31 is directly formed on the collar oxide layer 14 with no spacer insulation layer therebetween as shown in FIGS. 22A and 22B. The fourth embodiment remains unchanged from the second and third embodiments in other portions.

The method of manufacturing the semiconductor memory device shown in FIGS. 22A and 22B remains unchanged from those in the second and third embodiments except for the following points. That is, in the second embodiment, the step of forming the spacer insulation layer 15 after the process shown in FIGS. 17A and 17B is omitted. In the third embodiment, the step of forming the spacer insulation layer 15 in the process shown in FIGS. 18A and 18B is omitted. The fourth embodiment remains unchanged from the second and third embodiments in other steps.

The fourth embodiment provides the same advantages as the first embodiment except for the following point. That is, in the fourth embodiment, although the advantage resulting from the spacer insulation layer 15 as described in the first embodiment cannot be obtained, the area of contact between the connecting conductive layer 31 and the source/drain diffusion layer 25 is increased in comparison with the first embodiment; thus, the resistance in this portion can be reduced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
    a semiconductor substrate;
    a first insulation layer formed on an inner surface of a trench formed in the semiconductor substrate and having its top located above the surface of the semiconductor substrate;

a diffusion layer formed within the semiconductor substrate, surrounding the deep portion of the trench;

a first conductive layer filled in the trench;

a gate electrode provided on a gate insulation layer formed on the surface of the semiconductor substrate;

source/drain diffusion layers formed in the surface of the semiconductor substrate, sandwiching a channel region below the gate electrode;

a second conductive layer extending on the first conductive layer, the first insulation layer, and one of the source/drain diffusion layers; and a device isolation insulation layer having in its surface a concave whose bottom is located below a top of the first conductive layer.

2. The device according to claim 1, wherein the first insulation layer is provided on the inner surface of the trench without exposing a side of the semiconductor substrate within the trench.

3. The device according to claim 2, wherein the second conductive layer is provided without contacting the side of the semiconductor substrate.

4. The device according to claim 1, wherein a top of the first conductive layer is located above the surface of the semiconductor substrate.

5. The device according to claim 1, further comprising a second insulation layer overlying the top of the first insulation layer.

6. The device according to claim 1, further comprising a third insulation layer provided on the first conductive layer and consisting of a same material of the first insulation layer.

7. The device according to claim 6, wherein the device isolation insulation layer consists of a same material as the first and third insulation layers and the bottom of the concave of the device isolation insulation layer is located above the surface of the semiconductor substrate.

8. The device according to claim 1, wherein an end of the one of the source/drain diffusion layers on which the second conductive layer extends contacts a side of the first insulation layer.

9. The device according to claim 1, wherein the second conductive layer electrically connects the first conductive layer to the one of the source/drain diffusion layers on which the second conductive layer extends.

10. A semiconductor memory device comprising:

a semiconductor substrate;

a first insulation layer formed on an inner surface of a trench formed in the semiconductor substrate and having its top located above a surface of the semiconductor substrate;

a diffusion layer formed within the semiconductor substrate, surrounding the deep portion of the trench;

a first conductive layer filled in the trench;

a gate electrode provided on a gate insulation layer formed on the surface of the semiconductor substrate, a bottom surface of the gate electrode being lower than a top surface of the first conductive layer;

source/drain diffusion layers formed in the surface of the semiconductor substrate, sandwiching a channel region below the gate electrode;

a second conductive layer extending on the first conductive layer, the first insulation layer, and one of the source/drain diffusion layers; and a device isolation insulation layer having in its surface a concave whose bottom is located below a top of the first conductive layer.

11. The device according to claim 10, wherein the first insulation layer is provided on the inner surface of the trench without exposing a side of the semiconductor substrate within the trench.

12. The device according to claim 11, wherein the second conductive layer is provided without contacting the side of the semiconductor substrate.

13. The device according to claim 10, wherein a top of the first conductive layer is located above the surface of the semiconductor substrate.

14. The device according to claim 10, further comprising a second insulation layer overlying the top of the first insulation layer.

15. The device according to claim 10, further comprising a third insulation layer provided on the first conductive layer and consisting of a same material of the first insulation layer.

16. The device according to claim 15, wherein the device isolation insulation layer consists of a same material as the first and third insulation layers and the bottom of the concave of the device isolation insulation layer is located above the surface of the semiconductor substrate.

17. The device according to claim 10, wherein an end of the one of the source/drain diffusion layers on which the second conductive layer extends contacts a side of the first insulation layer.

18. The device according to claim 10, wherein the second conductive layer electrically connects the first conductive layer to the one of the source/drain diffusion layers on which the second conductive layer extends.

19. The device according to claim 1, further comprising a dummy gate electrode provided above the device isolation insulation layer and having a thickness thinner than that of the gate electrode.

20. The device according to claim 10, further comprising a dummy gate electrode provided above the device isolation insulation layer and having a thickness thinner than that of the gate electrode.

* * * * *